United States Patent
Cho et al.

(10) Patent No.: US 9,037,886 B2
(45) Date of Patent: May 19, 2015

(54) TIME-TO-DIGITAL SYSTEM AND ASSOCIATED FREQUENCY SYNTHESIZER

(75) Inventors: Yi-Hsien Cho, Zhubei (TW); Robert Bogdan Staszewski, Delft (NL)

(73) Assignee: MEDIATEK INC., Hsin-Chu (TW)

( * ) Notice: Subject to any disclaimer, the term of this patent is extended or adjusted under 35 U.S.C. 154(b) by 392 days.

(21) Appl. No.: 13/450,242

(22) Filed: Apr. 18, 2012

(65) Prior Publication Data

US 2013/0093471 A1    Apr. 18, 2013

Related U.S. Application Data

(60) Provisional application No. 61/548,096, filed on Oct. 17, 2011.

(51) Int. Cl.
G06F 1/32 (2006.01)
H03L 7/081 (2006.01)

(52) U.S. Cl.
CPC . *H03L 7/081* (2013.01); *G06F 1/32* (2013.01)

(58) Field of Classification Search
None
See application file for complete search history.

(56) References Cited

U.S. PATENT DOCUMENTS

| | | |
|---|---|---|
| 7,180,339 B2 | 2/2007 | Lanier |
| 7,205,924 B2 | 4/2007 | Vemulapalli et al. |
| 7,279,988 B1 | 10/2007 | Janesch et al. |
| 7,940,099 B2 | 5/2011 | Weltin-Wu et al. |
| 8,090,068 B2 | 1/2012 | Sun et al. |
| 8,237,511 B2 | 8/2012 | Kobayashi |
| 8,248,106 B1 | 8/2012 | Cohen et al. |
| 8,362,815 B2 | 1/2013 | Pavlovic et al. |
| 8,390,349 B1 | 3/2013 | Ravi et al. |
| 8,395,428 B2 | 3/2013 | Mateman et al. |
| 8,433,025 B2 | 4/2013 | Sun et al. |
| 2006/0103566 A1* | 5/2006 | Vemulapalli et al. ......... 341/155 |
| 2007/0188244 A1 | 8/2007 | Waheed et al. |
| 2008/0157839 A1* | 7/2008 | Staszewski et al. ........... 327/161 |
| 2009/0175399 A1 | 7/2009 | Sun et al. |
| 2009/0262878 A1* | 10/2009 | Sun et al. ...................... 375/376 |
| 2011/0156783 A1 | 6/2011 | Pavlovic et al. |
| 2011/0234270 A1 | 9/2011 | Kobayashi |
| 2013/0093469 A1 | 4/2013 | Lin et al. |
| 2013/0093471 A1 | 4/2013 | Cho et al. |

OTHER PUBLICATIONS

Office Action issued by USPTO for U.S. Appl. No. 13/450,225 on Jun. 12, 2013.
Notice of Allowance issued by the USPTO for co-pending U.S. Appl. No. 13/450,208 dated Aug. 21, 2013.

* cited by examiner

*Primary Examiner* — Paul Yanchus, III
(74) *Attorney, Agent, or Firm* — McClure, Qualey & Rodack, LLP

(57) ABSTRACT

A time-to-digital system, such as a frequency synthesizer, includes a power management circuit and a time-to-digital converter (TDC). Said power management circuit is coupled to a frequency reference clock and a variable clock, and arranged to output a delayed frequency reference clock and a single pulse of said variable clock ahead of a transition of said delayed frequency reference clock. Said TDC is coupled to said power management circuit and arranged to produce a digital TDC output.

23 Claims, 13 Drawing Sheets

TIME-TO-DIGITAL SYSTEM AND ASSOCIATED FREQUENCY SYNTHESIZER

This application claims the benefit of U.S. provisional application Ser. No. 61/548,096, filed Oct. 17, 2011, the subject matter of which is incorporated herein by reference.

FIELD OF THE INVENTION

The present invention relates to frequency synthesizer, and more particularly, to frequency synthesizer including peripheral mechanism supporting time-to-digital conversion with improvement of reduced hardware complexity, lower power consumption, suppressed supply interference, reduced layout area and enhanced linearity, etc.

BACKGROUND OF THE INVENTION

Various communication systems, such as wireless communication systems of radio frequency (RF), are broadly adopted and play an important role in modern information society. A core technique for modern communication systems is frequency (and/or clock) synthesis, which generates a variable clock of a desired frequency based on a frequency reference clock, such that stability, accuracy, and spectral purity of the variable clock correlate with performance of the frequency reference clock. In a transmitter, the variable clock provided by a local frequency synthesizer can be utilized as a local oscillation carrier for an up-conversion frequency translation from baseband or intermediate-frequency (IF) signals to RF signals. On the other hand, in a receiver, the variable clock provided by a local frequency synthesizer can be adopted as a local oscillation carrier for a down-conversion from RF signals to IF/baseband signals.

SUMMARY OF THE INVENTION

A frequency synthesizer accepts a frequency reference clock and a frequency command word (FCW) for input, and outputs a variable clock in response, such that a frequency of the variable clock is an FCW multiple of the frequency reference clock. A high-speed variable clock of frequency in an order of GHz can therefore be generated based on a stable low-speed frequency reference clock of frequency in an order of tens of MHz, for example.

An embodiment of the invention provides a time-to-digital system, such as a frequency synthesizer, including a frequency reference input for receiving a frequency reference clock, a variable clock input for receiving a variable clock of higher frequency than said frequency reference clock, a power management circuit and a time-to-digital converter (TDC). Said power management circuit is coupled to said frequency reference input and said variable clock input, and arranged to output a delayed frequency reference clock and a single pulse of said variable clock ahead of a transition of said delayed frequency reference clock. Said TDC is coupled to said power management circuit for producing a digital TDC output.

In an embodiment, said power management circuit includes a first logic gate, a delayer and a second logic gate. Said first logic gate is coupled to said frequency reference clock and said delayed frequency reference clock, and arranged to provide a gating signal in response to a first logic operation result of said frequency reference clock and said delayed frequency reference clock. Said delayer is coupled to said frequency reference clock and said first logic gate for providing said delayed frequency reference clock by delaying said frequency reference clock. Said second logic gate is coupled to said gating signal and said variable clock for providing said single pulse of said variable clock in response to a second logic operation result of said variable clock and said gating signal.

When said frequency reference clock transits from a first level (e.g., a level of logic 0) to a second level (a level of logic 1), said first logic gate is arranged to set said gating signal to said second level; when said delayed frequency reference clock subsequently transits from said first level to said second level, said first logic gate is arranged to set said gating signal to said first level. When said gating signal is of said first level, said second logic gate is arranged to suppress pulses of said variable clock; and when said gating signal is of said second level, said second logic gate is arranged to provide said single pulse of said variable clock by tracking said variable clock.

In an embodiment, said power management circuit includes a first logic gate, a delayer, a level sense circuit and a second logic gate. Said first logic gate is coupled to said frequency reference clock and said delayed frequency reference clock, and arranged to provide a first gating signal in response to a first logic operation result of said frequency reference clock and said delayed frequency reference clock. Said delayer is coupled to said frequency reference clock and said first logic gate for providing said delayed frequency reference clock by delaying said frequency reference clock. Said level sense circuit is coupled to said variable clock, said first gating signal and said second logic gate for providing a second gating signal in response to said variable clock and said first gating signal. Said second logic gate is coupled to said second gating signal and said variable clock for providing said single pulse of said variable clock in response to a second logic operation result of said variable clock and said second gating signal.

When said frequency reference clock transits from a first level to a second level, said first logic gate is arranged to set said first gating signal to said second level, and when said delayed frequency reference clock subsequently transits from said first level to said second level, said first logic gate is arranged to set said first gating signal to said first level. When said first gating signal transits from said first level to said second level while said variable clock is of said first level, said level sense circuit is arranged to set said second gating signal to said second level; and when said first gating signal transits from said first level to said second level while said variable clock is of said second level, said level sense circuit is arranged to set said second gating signal to said second level when said variable clock transits back to said first level.

When said second gating signal is of said first level, said second logic gate is arranged to suppress pulses of said variable clock; and when said second gating signal is of said second level, said second logic gate is arranged to provide said single pulse of said variable clock by tracking said variable clock. Said level sense circuit is also arranged to set said second gating signal to said first level when said first gating signal transits to said first level. In an embodiment, said level sense circuit includes a latch.

In an embodiment, said time-to-digital system further comprises a phase shifter and an oscillator such that said time-to-digital system functions as a frequency synthesizer. Said phase shifter is coupled to said power management circuit, and arranged to adjust a time difference between a transition of said frequency reference clock and a subsequent transition of said variable clock, such that said time difference is less than a period of said variable clock. Said oscillator is coupled to said variable clock input for tuning periods of said variable clock according to said digital TDC output.

An embodiment of the invention provides a frequency synthesizer including a power management circuit, a TDC, an oscillator, a phase shifter and a shift controller. Said power management circuit is arranged to output a second reference clock and a second variable clock in response to a first reference clock and a first variable clock, such that a single pulse between a transition of said first reference clock and a subsequent transition of said second reference clock is provided in said second variable clock. Said TDC is coupled to said power management circuit, and arranged to provide a first fractional error correction signal by quantizing a time difference between said second reference clock and said second variable clock.

In an embodiment, said shift controller is coupled to said phase shifter, and arranged to provide a shift control signal and a second fractional error correction signal in response to an accumulated value of FCW. Said oscillator is further arranged to tune periods of said first variable clock according to said first fractional error correction signal and said second fractional error correction signal.

In an embodiment, said oscillator is arranged to provide an original variable clock. Said phase shifter is coupled between said oscillator and said power management circuit, and arranged to provide said first variable clock by shift a phase of said original variable clock, such that a time difference between a transition of said first reference clock and a transition of said first variable clock is less than a period of said original variable clock. Said phase shifter is arranged to adjust a phase offset between said original variable clock and said first variable clock in response to said shift control signal.

In an embodiment, said phase shifter is coupled to an original reference clock and said power management circuit, and arranged to provide said first reference clock by shift a phase of said original reference clock, such that a time difference between a transition of said first reference clock and a transition of said first variable clock is less than a period of said original variable clock. Said phase shifter is arranged to adjust a phase offset between said original reference clock and said first reference clock in response to said shift control signal.

In an embodiment, said power management circuit includes a first logic, a delayer and a second logic. Said first logic is coupled to said first reference clock and said second reference clock, and arranged to provide a gating signal in response to a first logic operation result of said first reference clock and said second reference clock. Said delayer is coupled to said first reference clock and said first logic gate for providing said second reference clock by delaying said first reference clock. Said second logic gate is coupled to said gating signal and said first variable clock for providing said second variable clock in response to a second logic operation result of said first variable clock and said gating signal.

When said first reference clock transits from a first level to a second level, said first logic gate is arranged to set said gating signal to said second level; and when said second reference clock subsequently transits from said first level to said second level, said first logic gate is arranged to set said gating signal to said first level. When said gating signal is of said first level, said second logic gate is arranged to suppress pulses of said second variable clock; and when said gating signal is of said second level, said second logic gate is arranged to provide said single pulse of said second variable clock by tracking said first variable clock.

In an embodiment, said power management circuit includes a first logic gate, a delayer, a level sense circuit and a second logic gate. Said first logic gate is coupled to said first reference clock and said second reference clock, and arranged to provide a first gating signal in response to a first logic operation result of said first reference clock and said second reference clock. Said delayer is coupled to said first reference clock and said first logic gate for providing said second reference clock by delaying said first reference clock. Said level sense circuit is coupled to said first variable clock, said first gating signal and said second logic gate for providing a second gating signal in response to said first variable and said first gating signal. Said second logic gate is coupled to said second gating signal and said variable clock for providing said second variable clock in response to a second logic operation result of said first variable clock and said second gating signal.

When said first reference clock transits from a first level to a second level, said first logic gate is arranged to set said first gating signal to said second level, and when said second reference clock subsequently transits from said first level to said second level, said first logic gate is arranged to set said first gating signal to said first level. When said first gating signal transits from said first level to said second level while said first variable clock is of said first level, said level sense circuit is arranged to set said second gating signal to said second level; and when said first gating signal transits from said first level to said second level while said first variable clock is of said second level, said level sense circuit is arranged to set said second gating signal to said second level when said first variable clock transits back to said first level.

When said second gating signal is of said first level, said second logic gate is arranged to suppress pulses of said second variable clock; and when said second gating signal is of said second level, said second logic gate is arranged to provide said single pulse of said second variable clock by tracking said first variable clock.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1:
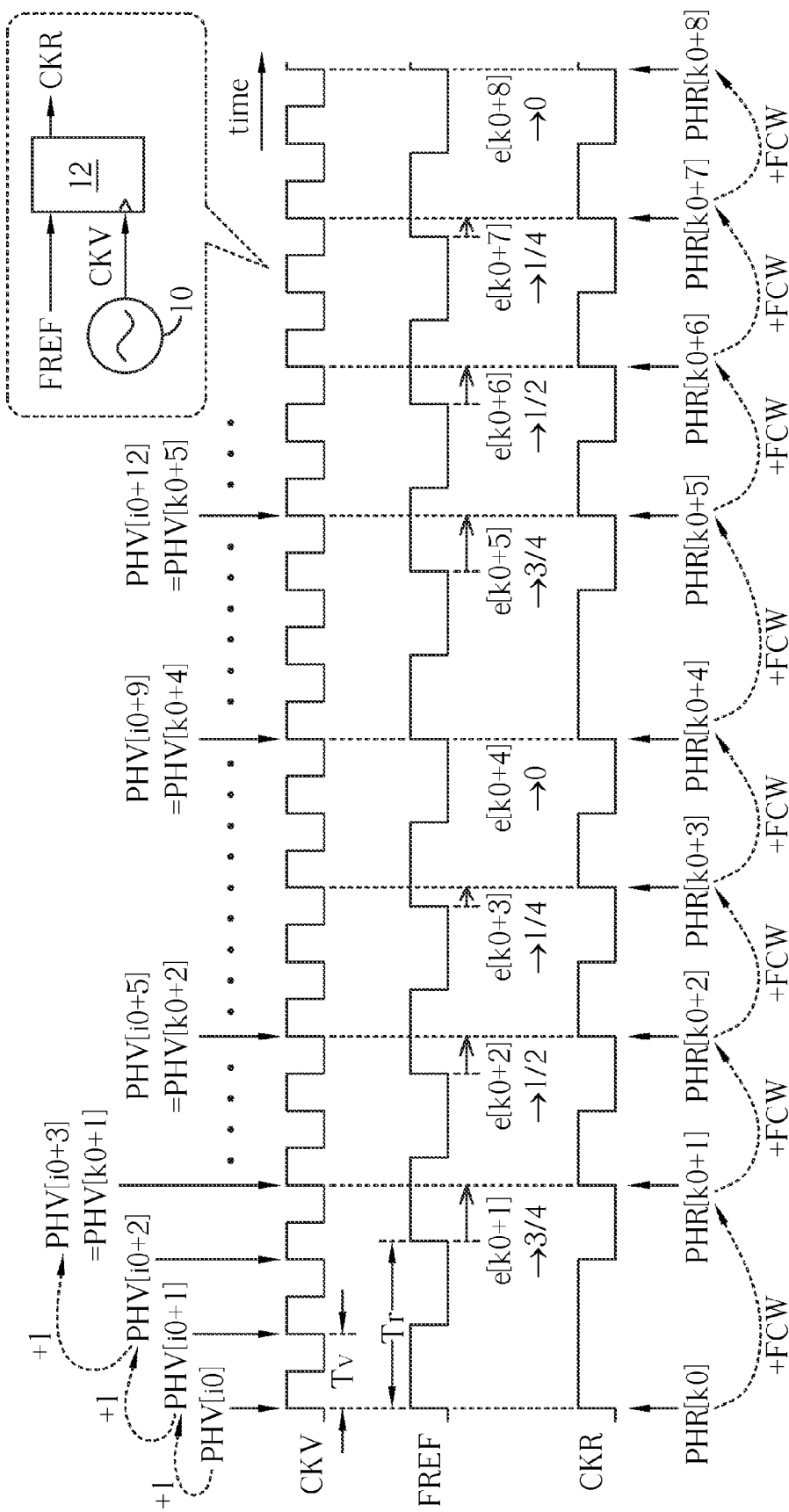
FIG. 1 illustrates an embodiment of digitally tracking phases of a variable clock and a frequency reference clock.

Please refer to FIG. 1 illustrating a conceptual embodiment for digitally tracking phases of a clock CKV and a clock FREF, such that frequency of the clock CKV is an FCW multiple of frequency of the clock FREF. That is, by assigning a corresponding FCW, a clock CKV of a desired frequency is produced based on a clock FREF. The clock FREF is a frequency reference clock of a period Tr. The clock CKV, generated by an oscillator 10, e.g., a digitally controlled oscillator (DCO), is a variable clock of a period Tv. For frequency synthesis, the oscillator 10 is tuned so that the clock CKV locks to the clock CKR, so frequency of the clock CKV approaches FCW multiple the clock FREF in the limit, i.e., the average period Tv equals Tr/FCW. The FCW is in general a real number with an integer part and a fractional part; in the example of FIG. 1, the FCW is 9/4 with an integer part equal to 2 and a fractional part equal to ¼.

To digitally represent phase of the clock CKV, a signal (e.g., a digital word) PHV[i] is provided. The signal PHV[i], as a variable phase signal, accumulates a unit count at every significant transition (e.g., rising edge) of the clock CKV, i.e., PHV[i+1]=PHV[i]+1 with index i indicating a time stamp of the i-th significant transition of the clock CKV. That is, as time progresses, the variable phase signal PHV[i] accumulates a count of periods of the clock CKV to reflect phase of the clock CKV in terms of the period Tv. The signal PHV[i] is an integer since it accumulates integers.

While digitally representing phase of the clock FREF, phase information of the clock FREF is synchronized with significant transitions of the clock CKV, so phase information of the clock FREF can be compared with the signal PHV[i], which updates at significant transitions of the clock CKV. Therefore, the clock FREF is re-timed to a clock CKR by a re-timer 12 (e.g., a flip-flop). The re-timer 12 is arranged to provide the re-timed reference clock CKR by re-timing the clock FREF at significant transitions of the clock CKV, such that each transition of the clock CKR aligns with a significant transition of the clock CKV. In response to triggering of the clock CKR, a signal PHR[k] is provided to digitally reflect phase of the clock FREF. The signal PHR[k], as a reference phase signal, accumulates the FCW at every significant transition of the clock CKR, i.e., PHR[k+1]=PHR[k]+FCW, with index k indicating a time stamp of the k-th significant transition of the clock CKR.

As the period Tr of the clock FREF is expected to be an FCW multiple of the period Tv of the clock CKV, accumulating FCW on each period of the clock CKR is used to reflect phase of the clock FREF in terms of the period Tv. Since the FCW generally has a fractional part, the signal PHR[k] also has a fractional part in general.

Because the clock CKR is re-timed by the clock CKV, each significant transition of the clock CKR aligns with a significant transition of the clock CKV, then the signal PHV[k], i.e., the signal PHV[i] at k-th significant transition of the clock CKR, can be compared with the signal PHR[k]. In the example of FIG. 1, the signal PHV[i0] aligns with the signal PHR[k0], and the signal PHV[i0+3]=PHV[k0+1] synchronizes with the signal PHR[k0+1], etc. As shown in FIG. 1, re-timing the clock FREF to the clock CKR by triggering of the clock CKV induces an error e[k], representing a time difference (phase error) between a significant transition of the clock FREF and a subsequent significant transition (i.e., the closest significant transition after the significant transition of the clock FREF) of the clock CKV.

In the example of FIG. 1, when the clock CKV locks the clock FREF with the desired relation Tv=Tr/FCW, every four cycles of the period Tr will align with every nine cycles of the periods Tv, since FCW=9/4. That is, accumulating the FCW four times equals accumulating the unit count nine times, for FCW*4=(9/4)*4=1*9. Assuming the significant transitions of the clocks FREF and CKV align at the time stamp k0 such that the values of the signals PHR[k0] and PHV[i0] are equal, then, after four cycles of the clock CKR, the significant transitions of the clocks FREF and CKV align again, and the value of the signal PHR[k0+4] also meets the value of the signal PHV[i0+9] (i.e., PHV[k0+4]), because PHR[k0+4]=PHR[k0]+FCW*4, and PHV[i0+9]=PHV[i0]+1*9. On the other hand, owing to the fractional part of the FCW, the time difference between a significant transition of the clock FREF and a subsequent significant transition of the clock CKV is non-zero at each time stamp k between the time stamps k0 and (k0+4) even when the clock CKV locks to the clock FREF, and the time difference is reflected by an arithmetic difference between the signals PHV[k] and PHR[k]. For example, at the time stamp (k0+1), the significant transition of the clock FREF is ahead of the subsequent significant transition of the clock CKV by (¾)*Tv when the clock CKV locks the clock FREF, and the arithmetic difference between signals PHV[k0+1] and PHR[k0+1] indicates the time difference by (PHV[k0+1]−PHR[k0+1])=(3−9/4)=¾. Similarly, at the time stamp (k0+2), the "misalignment" of (½)*Tv between the significant transitions of the clock FREF and CKV is reflected by (PHV[k0+2]−PHR[k0+2])=(5−18/4)=2/4=(½).

As the time stamp k progresses, the difference (PHV[k]−PHR[k]) between the signals PHV[k] and PHR[k] varies regularly and periodically, and reflects a deterministic time difference (phase error) between (the significant transitions of) the clocks FREF and CKV in terms of the period Tv. Hence, the difference (PHV[k]−PHR[k]) becomes a deterministic part of the error e[k], reflecting a regular phase error due to the fractional part of the FCW. That is, when the clock CKV locks the clock FREF, the error e[k] equals (PHV[k]−PHR[k]), or PHR[k]+e[k]−PHV[k]=0.

The regular misalignment between the significant transition of the clock FREF and the subsequent significant transition of the clock CKV is in a range of one period Tv; equivalently, the difference (PHV[k]−PHR[k]), which leads to the deterministic part of the error e[k], is a fractional number in general (or equal to zero). Since the signal PHV[k] is an integer, the deterministic part of the error e[k] is related to the fractional part of the PHR[k]. For practical application, the error e[k] also includes a fluctuating part of random nature, reflecting stochastic phase error due to noise of the oscillator 10, etc.

To be more general, let the FCW be expressed by Nv/Nr with Nv and Nr being integers and Nv not an integer multiple of Nr, then the deterministic part of the error e[k] periodically repeats every Nr cycles of the clock CKR; that is, the deterministic parts of the errors e[k] and e[k+Nr] are equal, and can be predicted according to the fractional part of the accumulated value of the FCW (i.e., the signal PHR[k]) and the signal PHV[k]. Assuming the signals PHV[k0] and PHR[k0] are equal at the time stamp k0, tuning the oscillator 10 to match integer part of the signal PHR[k] and the integer-valued signal PHV[k] every Nr cycles of the clock CKR (e.g., at time stamps k0 and (k0+Nr), etc) suggests a frequency lock. However, as Nr cycles of the clock CKR covers many cycles of the clock CKV, the period Tv of the clock CKV drifts or wanders if the error e[k] is not fully monitored during these Nr cycles of the clock CKR. For a finer phase lock, a time-to-digital converter (TDC) is therefore adopted to digitally detect the error e[k] every cycle of the clock CKR, so the oscillator 10 can be tuned according to a digital TDC output of the TDC to ensure (PHR[k]+e[k]−PHV[k]) approaches zero at each time stamp k.

Figure 2:
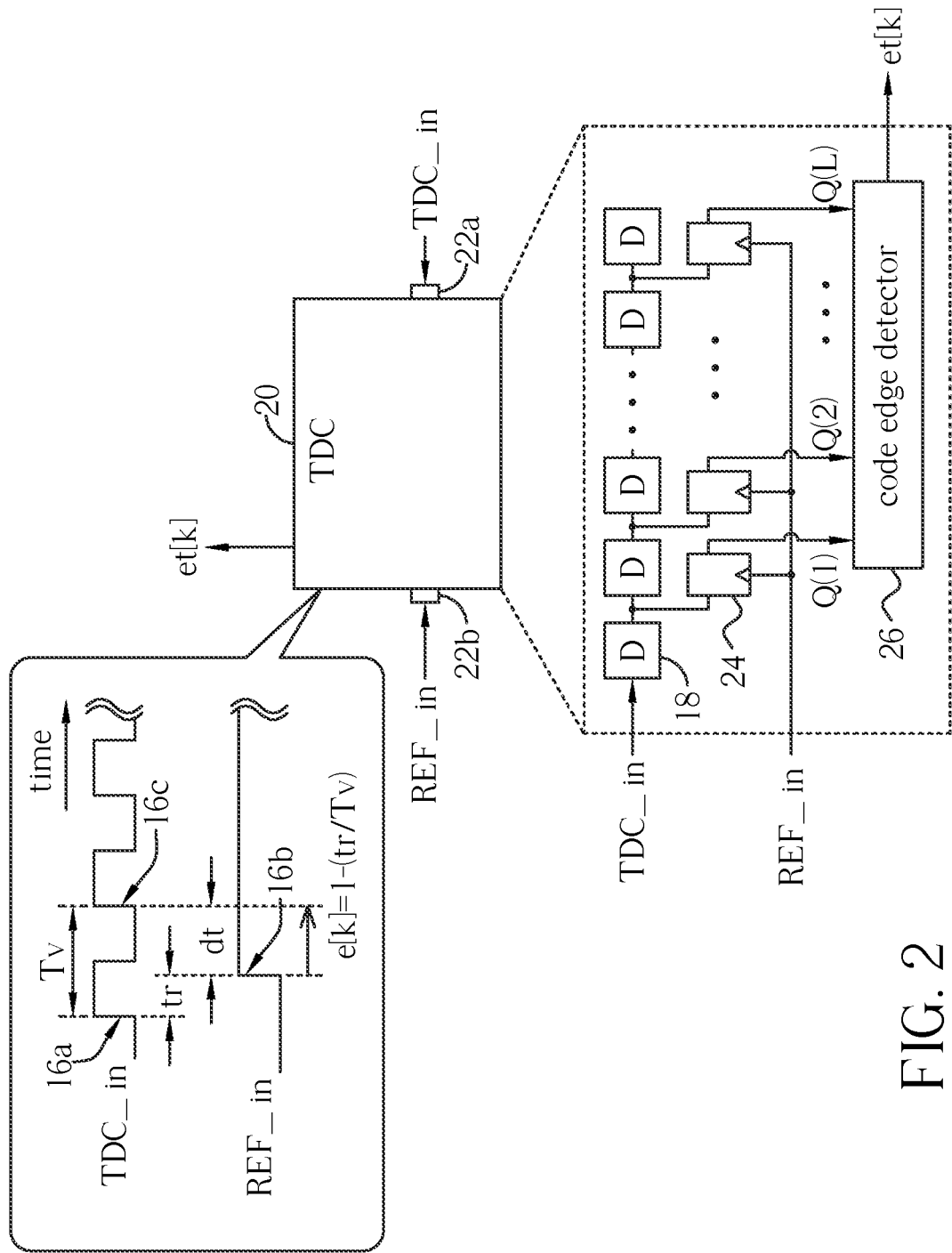
FIG. 2 illustrates an embodiment of a TDC.

Please refer to FIG. 2 illustrating an embodiment of a TDC 20. The TDC 20 is coupled to two inputs 22a and 22b for respectively receiving two signals TDC_in and REF_in, and outputs a signal et[k] as a digital TDC output. While the TDC 20 is adopted to detect the error e[k] shown in FIG. 1, the clocks FREF and CKV are respectively received as the signals REF_in and TDC_in. The TDC 20 is arranged to preferably quantize a time difference dt between a significant transition 16b of the signal REF_in and a subsequent transition 16c of the signal TDC_in, thus the error e[k] is represented by the digital signal et[k]. In an embodiment, the TDC 20 is a causal system; hence it cannot 'see' the next edge 16c of the variable clock at the time of the rising edge 16b of REF_in clock. Consequently, the desired measurement is performed indirectly by subtracting a time tr value from the period Tv. In an embodiment, the rising time tr between a significant transition 16a of the signal TDC_in and the subsequent significant transition 16b of the signal REF_in is measured and quantized; since dt=(Tv−tr), the error e[k] is derived as e[k]=(dt/Tv)=(1−(tr/Tv)). Note that in the embodiment, TDC 20 does not generate e[k] directly but a quantized value of tr, which is then divided by the Tv period or multiplied by 1/Tv_avg. Hence, the direct TDC output is a quantized value of tr/Tv, which corresponds to a negative of the error e[k]. It should be appreciated by one skilled in the art that the negation operation is easily achieved by inverting a sign of the adder 50 input (discussed in FIG. 3). Hence, minimizing tr, which is the timing separation between TDC 20 inputs REF_in and TDC_in, is equivalent to maximizing e[k] (which cannot be greater than 1). Since the constant '1' in (1−e[k]) is easily absorbed in the PLL system, (1−e[k]) can be conveniently denoted as −e[k]. This way the timing separation between the significant transition 16b of the signal REF_in and the following significant transition 16c of the signal TDC_in (denoted as e[k]) and the prior significant transition 16a of the signal TDC_in (denoted as −e[k]) can be both used depending on convenience.

An embodiment of the TDC 20 includes a plurality (e.g., a number L) of serially connected delay units 18 (e.g., invertors), a plurality of flip-flops 24 triggered by the signal REF_in, and a code edge detector 26. Each delay unit 18 imposes a unit delay time t_inv to the signal TDC_in, and outputs the delayed signal to a corresponding flip-flop 24 and a next delay unit 18. When the significant transition of the signal REF_in triggers the flip-flops 24 to obtain a code of bits Q(1), Q(2), ... Q(L), occurrence of the significant transition 16a is reflected by a code edge in the code of the bits Q(1) to Q(L), and the rise time tr is quantized in terms of the unit delay time t_inv by the code edge detector 26 and outputted as the signal et[k]. That is, a time quantization resolution of the TDC 20 is determined by the unit delay time t_inv of each delay unit 18. The total number L of the delay unit 18 determines a measuring range (a TDC range) of the TDC 20; the TDC range of the TDC is approximately L*t_inv. A time interval shorter than the TDC range can be measured, and a time interval longer than the TDC range is not detected by the TDC 20. While the TDC 20 is used to detect the error e[k] shown in FIG. 1, the TDC range should cover a full range of the period Tv.

To detect the error e[k] in finer resolution for better quality of the clock CKV, the unit delay time t_inv is set much shorter than the period Tv. Consequently, the TDC 20 needs a much larger number L of the delay unit 18 to cover a TDC range of the period Tv. For example, to cover a period of 2.4 GHz with 7 ps resolution, about sixty delay units 18 are applied to implement the TDC 20. As more delay units 18 are adopted, more power is consumed, and more supply interference (e.g., fluctuation and/or drop of supply voltages) is induced. To settle high supply interference, decoupling capacitors of large area must be utilized, and area to implement an effective TDC is therefore increased. Moreover, high supply interference degrades linearity of time-to-digital conversion, since amount of the unit delay time t_inv drifts when supply voltages fluctuate. Therefore, supporting peripherals to reduce required delay units and to enhance linearity of TDC are demanded.

Figure 3:
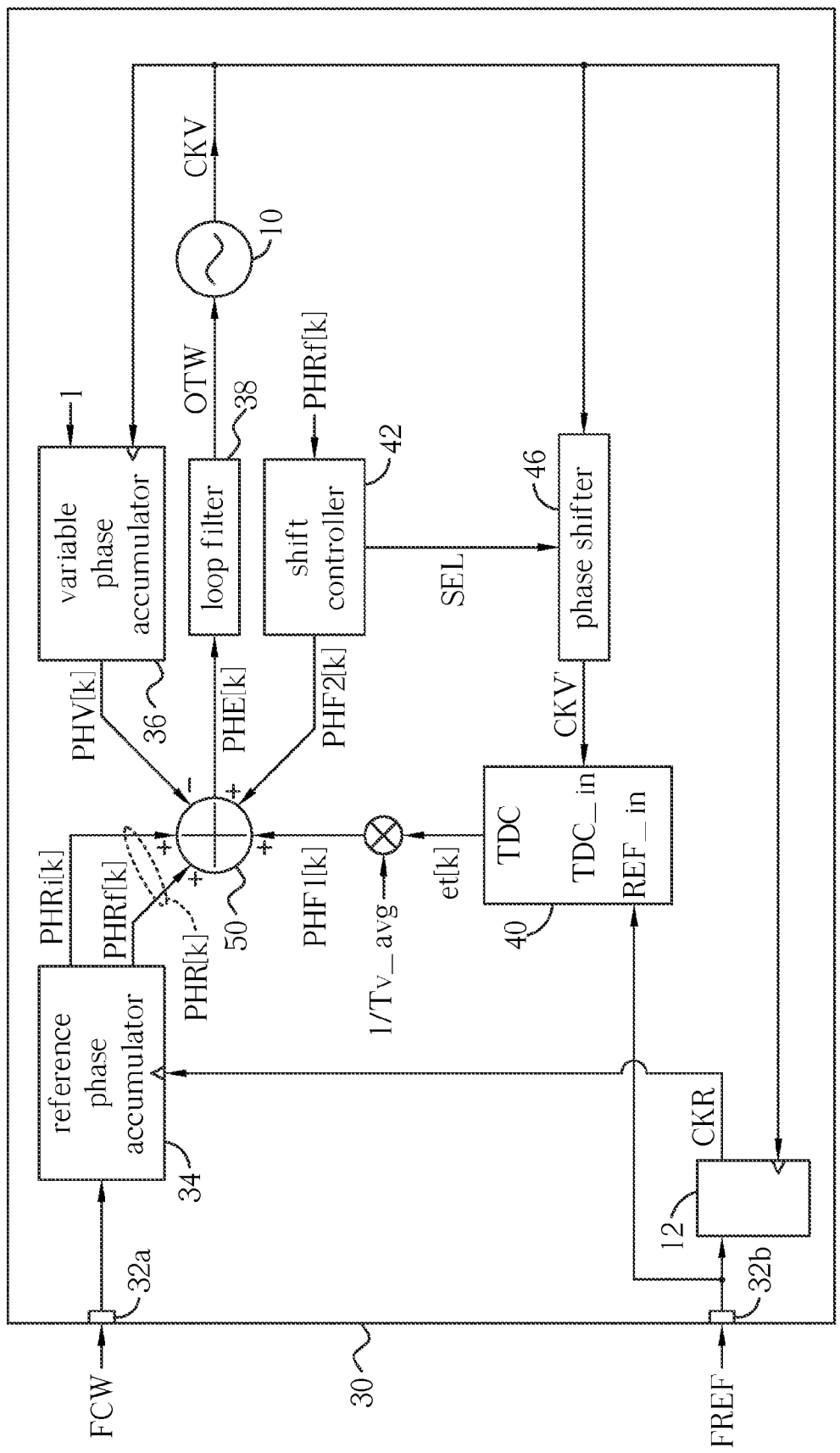
FIG. 3 and FIG. 4 respectively illustrate a frequency synthesizer and its operation according to an embodiment of the invention.

Please refer to FIG. 3 illustrating a frequency synthesizer 30 according to an embodiment of the invention. The frequency synthesizer 30 has an FCW input 32a for receiving FCW, a frequency reference input 32b for receiving a frequency reference clock FREF, a reference phase accumulator 34, a variable phase accumulator 36, a loop filter 38, an oscillator 10, a phase shifter 46, a shift controller 42, a TDC 40, an adder 50 and a re-timer 12. The oscillator 10 is arranged to provide a variable clock CKV, e.g., an RF clock, in response to an oscillator tuning word (OTW), such that the frequency of the variable clock CKV is FCW multiple of the frequency reference clock FREF when the variable clock CKV locks to the frequency reference clock FREF.

The re-timer 12 is coupled to the oscillator 10 and the frequency reference clock FREF, and arranged to provide a re-timed reference clock CKR by re-timing the frequency reference clock FREF at significant transitions (e.g., rising edges) of the variable clock CKV. The reference phase accumulator 34 is coupled to the frequency reference clock FREF through the frequency reference input 32b, and arranged to provide a reference phase signal PHR[k] by accumulating the FCW in response to each period of the frequency reference clock FREF, e.g., at significant transitions of the re-timed reference clock CKR. In FIG. 3, the reference phase signal PHR[k] is decomposed to a fractional part PHRf[k] and an integer part PHRi[k]. The variable phase accumulator 36 is coupled to the oscillator 10, and arranged to provide a variable phase signal PHV[k] by accumulating a count of periods of the variable clock CKV.

The phase shifter 46 is coupled to the oscillator 10 and the shift controller 42, and arranged to provide a shifted variable clock CKV' by changing phase of the variable clock CKV in response to a shift control signal SEL. Alternatively, the phase shifter 46 could perform phase changing by selecting one of a multiple of CKV phases. The generation of the multiple phases could be done internally to the phase shifter 46. The TDC 40 functions similar to the TDC 20 shown in FIG. 2; the TDC 40 is coupled to the phase shifter 46 and the frequency reference input 32b, arranged to receive the frequency reference clock FREF and the shifted variable clock CKV' as the signals REF_in and TDC_in, and arranged to provide a fractional error correction signal PHF1[k] in response to a time difference between the frequency reference clock FREF and the shifted variable clock CKV'. That is, the TDC 40 is arranged to detect (quantize) the time difference between a significant transition of the frequency reference clock FREF and a subsequent significant transition of the shifted variable clock CKV', and provide a signal et[k] to reflect the detected time difference; then the fractional error correction signal PHF1[k], indicating the time difference in terms of the period Tv of the variable clock CKV, is provided by normalizing the signal et[k] to an averaged period Tv_avg, which is a long-term average of the periods of the variable clock CKV, since the period Tv is in general a time-varying value.

To cooperate with the phase shifter 46, the shift controller 42 is coupled to the phase shifter 46 and arranged to provide the shift control signal SEL and another fractional error correction signal PHF2[k]. The adder 50 is coupled to the variable phase accumulator 36, the reference phase accumulator 34, the shift controller 42 and the TDC 40, and arranged to provide a signal PHE[k] in response to an arithmetic combination (PHR[k]+PHF1[k]+PHF2[k]−PHV[k]) of the reference phase signal PHR[k], the variable phase signal PHV[k] and the fractional error correction signals PHF1[k] and PHF2[k]. The loop filter 38 is coupled between the oscillator 10 and the adder 50, and arranged to provide the OTW in response to the signal PHE[k]. Thus, through the OTW, the oscillator 10 is arranged to tune periods of said variable clock CKV according to the reference phase signal PHR[k], the variable phase signal PHV[k] and the fractional error correction signals PHF1[k] and PHF2[k].

Figure 4:
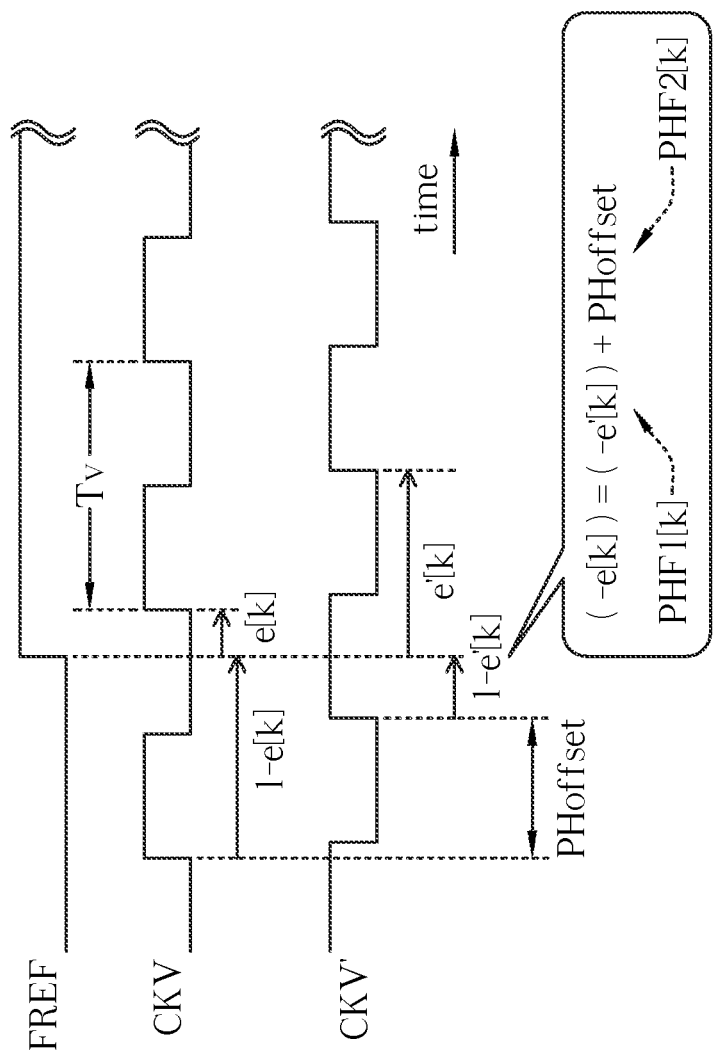

Please refer to FIG. 4 illustrating TDC operation of the frequency synthesizer 30 according to an embodiment of the invention. The phase shifter 46 (FIG. 3) is arranged to induce a phase offset PHoffset between the variable clock CKV and the shifted variable clock CKV'. With the phase offset PHoffset, the error (1−e[k]) between the frequency reference clock FREF and the previous variable clock CKV is decreased to a shorter error (1−e'[k]), i.e., decreased the timing separation between the frequency reference clock FREF and the shifted variable clock CKV', with −e[k]=−e'[k]+PHoffset. In other words, the phase offset PHoffset is such arranged that a time difference between a significant transition of the frequency reference clock FREF and a previous significant transition of the shifted variable clock CKV' is significantly less than a period Tv of the variable clock CKV; i.e., the error −e'[k] never grows larger than a portion of the period Tv. As the shifted variable clock CKV' and the frequency reference clock FREF are respectively received as the signals TDC_in and REF_in, the TDC 40 only needs to quantize the error −e'[k] significantly shorter than the period Tv. In other words, the TDC range of the TDC 40 just needs to cover a portion of one period Tv, instead of full range of the period Tv. The TDC 40 is arranged to respond only when a significant transition of the shifted variable clock CKV' and a significant transition of the frequency reference clock FREF occur in a proximity of the TDC range; the TDC 40 does not have to respond when significant transitions of the shifted variable clock CKV' and significant transitions of the frequency reference clock FREF do not occur in a proximity of the TDC range. Since the required TDC range is decreased, the TDC 40 benefit from lower quantity of required delay units; hardware complexity, power consumption, layout area, supply interference and linearity degradation of TDC 40 are then reduced without compromising TDC resolution.

As discussed in FIG. 1, the error e[k] includes a time-varying but predictable deterministic part corresponding to (PHR[k]−PHV[k]). Based on the regularly varying deterministic part of the error −e[k], the shift controller 42 dynamically sets the phase offset PHoffset by the shift control signal SEL, such that the phase offset PHoffset is subtracted from the deterministic part of the error −e[k] to become the error −e'[k]. For example, when the deterministic part of the error −e[k] is predicted to be in a range of ¼ (equivalent to a phase of 90 degrees) to ½ (180 degrees), the phase offset PHoffset can be set to 90 degrees (equivalent to ¼), hence the error −e'[k] is maintained in a range of 0 to ¼. Similarly, as time progresses, when the deterministic part of the error −e[k] enters a range of ½ to ¾, the phase offset PHoffset tracks to be set to 180 degrees (½ in terms of the period Tv), so the error −e'[k] is kept in a range of 0 to ¼. To compensate the subtracted phase offset PHoffset, the shift controller 42 injects the fractional error correction signal PHF2[k] to the adder 50 to reflect the phase offset PHoffset; with the fractional error correction signal PHF1[k] indicating the quantized error −e'[k], the error −e[k] is obtained by −e[k]=(PHF1[k]+PHF2[k]), corresponding to −e[k]=(−e'[k]+PHoffset). Then frequency synthesis is accomplished as the oscillator 10 tunes periods of the variable clock CKV to minimize (assuming type-II PLL) value of the signal PHE[k], i.e., minimize (PHR[k]−PHV[k]+e[k])=(PHR[k]−PHV[k]+PHF1[k]+PHF2[k]). In other words, the frequency synthesizer 30 can be analogous to an all-digital phase lock loop (ADPLL).

In an embodiment, the variable phase signal PHV[k], an integer, is a fixed point digital word of WI bits. The reference phase signal PHR[k] is a fixed point digital word of (WI+WF) bits combining an integer part of WI bits and a fractional part of WF bits. Each of the fractional error correction signals PHF1[k] and PHF2[k] is a fractional represented by a fixed point digital word of WF bits. The signal PHE[k] is a signed fixed point digital word of (WI+WF) bits including an integer part of WI bits and a fractional part of WF bits.

Figure 5:
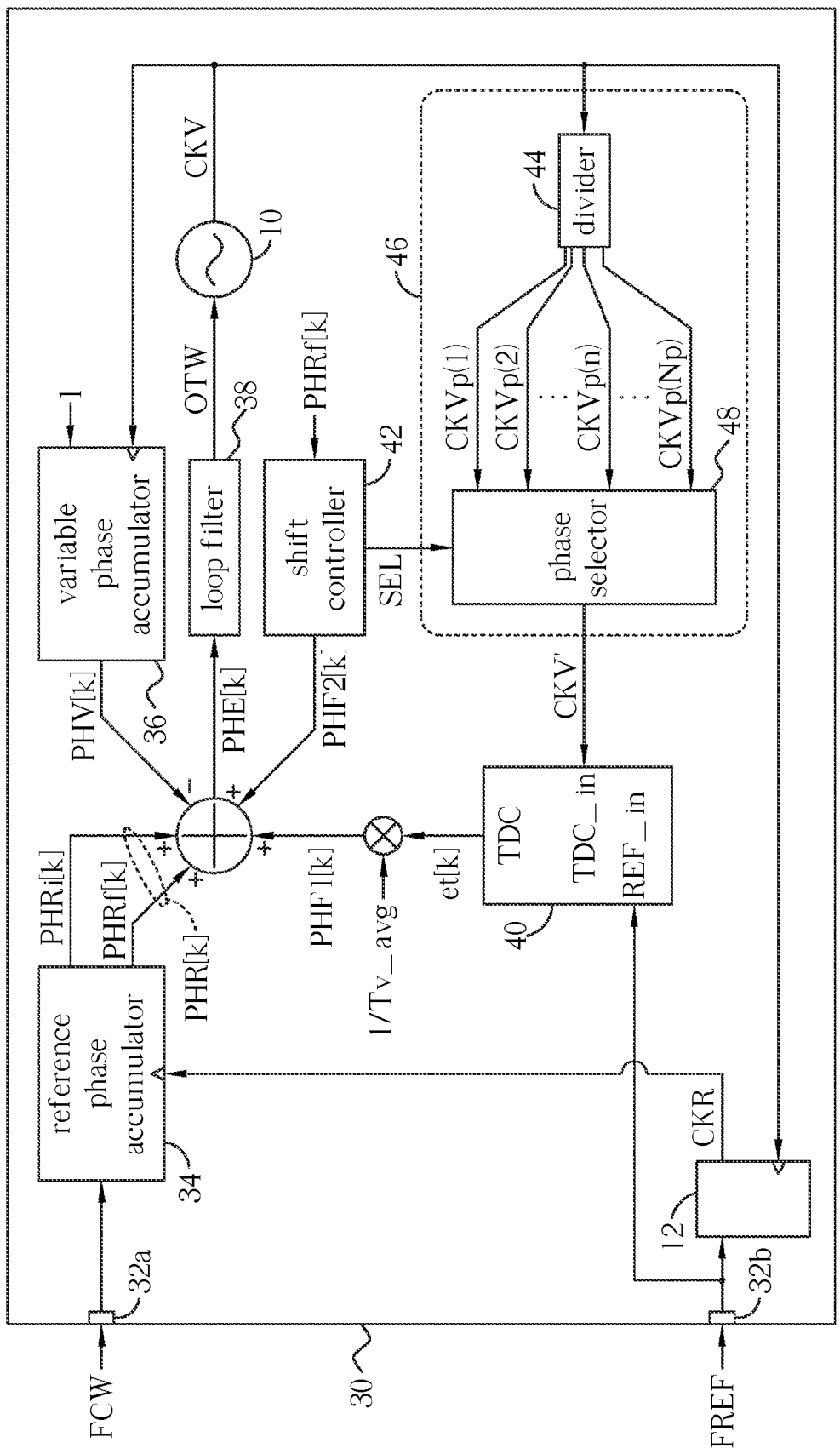
FIG. 5 and FIG. 6 respectively illustrate a frequency synthesizer and its operation principle according to an embodiment of the invention.

Please refer to FIG. 5 illustrating an example of the phase shifter 46 according to an embodiment of the invention. In FIG. 5, the phase shifter 46 includes a divider 44 and a phase selector 48. The divider 44 is coupled to the oscillator 10, and arranged to divide the frequency of the variable clock CKV and to provide a plurality of shifted clock candidates CKVp(1), CKVp(2), . . . , CKVp(n) to CKVp(Np) of different phases according to the variable clock CKV. For example, phase of the shifted clock candidate CKVp(n) is (n−1)*360/Np degrees different from phase of the shifted clock candidate CKVp(1). The phase selector is coupled to the divider 44 and the shift controller 42, and arranged to select one of the shifted clock candidates CKVp(1) to CKVp(Np) as the shifted variable clock CKV' in response to the shift control signal SEL of the shift controller 42.

Figure 6:
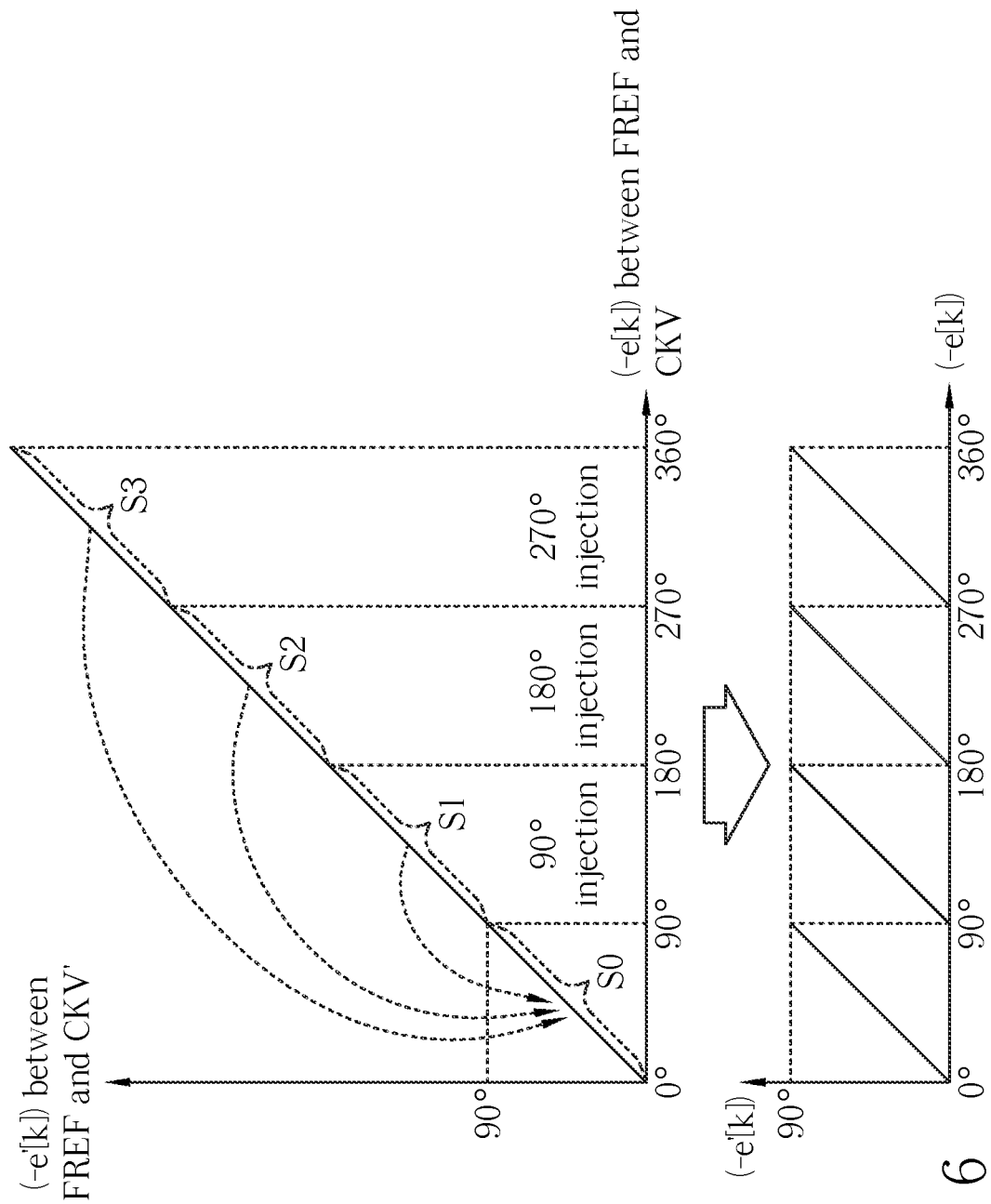

In an embodiment, the divider 44 is arranged to divide the frequency of the variable clock CKV by two, and to accordingly provide four shifted clock candidates CKVp(1) to CKVp(4) of quadrature phases, with phases of the variable clock CKV and the shifted clock candidate CKVp(n) separated by a phase offset of 90*(n−1) degrees, for n=1 to 4. Please refer to FIG. 6 illustrating the TDC operation based on quadrature phases. With one of the four quadrature phases selected as the shifted variable clock CKV', the full range of the error −e[k] which expands 360 degrees (or one period Tv of the variable clock CKV) is mapped to a smaller range of the error −e'[k], which extends only 90 degrees, or a quarter of the period Tv.

For example, when the error −e[k] is predicted to be in a range S0 of 0 to 90 degrees according to the fractional part PHRf[k] of the reference phase signal PHR[k], the shift controller 42 selects the shifted clock candidate CKVp(1) as the shifted variable clock, so the error −e'[k] is also in a range of 0 to 90 degrees; the shift controller 42 also injects a fractional error correction signal PHF2[k] equivalent of zero degrees to the adder 50. When the error −e[k] is predicted to be in a range S1 of 90 to 180 degrees, the shift controller 42 switches to select the shifted clock candidate CKVp(2) of a 90-degree phase offset as the shifted variable clock CKV', so the error −e'[k] is kept in the range of 0 to 90 degrees. Correspondingly, the shift controller 42 also injects a fractional error correction signal PHF2[k] equivalent of 90 degrees (¼ in terms of the period Tv) to the adder 50.

Similarly, when the error −e[k] is expected to be in a range S2 of 180 to 270 degrees, the shifted clock candidate CKVp(3) of a 180-degree separation from the shifted clock candidate CKVp(1) is selected, the error −e'[k] is then maintained in the range of 0 to 90 degrees; also, a fractional error correction signal PHF2[k] equivalent of 180 degrees is injected to the adder 50 (i.e., value of ½). When the error −e[k] is forecasted to be in a range S3 of 270 to 360 degrees, the shifted clock candidate CKVp(4) of a 270-degree separation from the shifted clock candidate CKVp(1) is selected, so the error −e'[k] is still in the range of 0 to 90 degrees; to compensate the 270-degree phase offset subtracted from the error −e[k], a fractional error correction signal PHF2[k] equivalent of 270 degrees is injected to the adder 50.

As shown in FIG. 5, because the TDC 40 is arranged to detect the error −e'[k] instead of the error −e[k], the TDC range of the TDC 40 only needs to cover a range of 0 to 90 degrees, or a quarter of the period Tv of the variable clock CKV, instead of full range of the period Tv.

For a brief summary of the embodiments shown in FIG. 3 to FIG. 6, peripherals for the TDC 40, including the phase shifter 46 and the shift controller 42, are provided. Based on the fractional part of the reference phase signal PHR[k], the regularly time-varying deterministic part of the error −e[k] can be predicted, so a corresponding phase offset PHoffset can be dynamically set and subtracted from the error −e[k] to provide the error −e'[k] which is kept in a range less than full range of the period Tv. The required TDC range of the TDC 40 is therefore decreased, and the TDC 40 benefits from lower hardware complexity (e.g., delay units and/or decoupling capacitors needed), reduced power consumption, smaller layout area, lower supply interference and enhanced linearity of time-to-digital conversion without compromising TDC temporal resolution. The shift controller 42 can be readily implemented by digital logic circuits.

Figure 7:
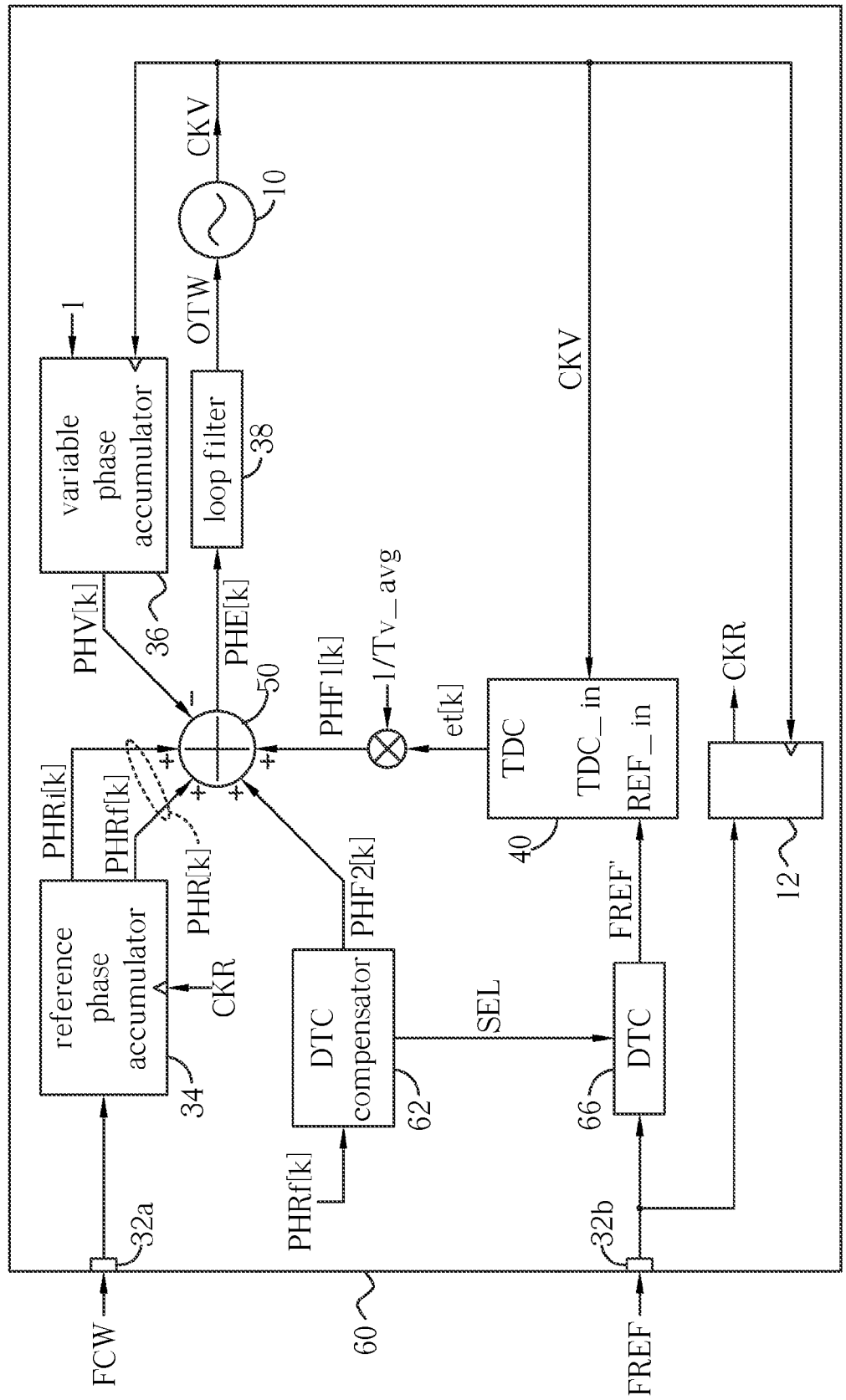
FIG. 7 and FIG. 8 respectively illustrate a frequency synthesizer and its operation according to an embodiment of the invention.

Please refer to FIG. 7 illustrating a frequency synthesizer 60 according to an embodiment of the invention. Similar to the frequency synthesizer 30 shown in FIG. 3, the frequency synthesizer 60 in FIG. 7 has an FCW input 32a for receiving an FCW, a frequency reference input 32b for receiving a frequency reference clock FREF, a reference phase accumulator 34, a variable phase accumulator 36, a loop filter 38, an oscillator 10, a shift controller 62, a phase shifter 66, a TDC 40, an adder 50 and a re-timer 12. The oscillator 10 is arranged to provide a variable clock CKV, e.g., an RF clock, in response to an oscillator tuning word (OTW), such that the frequency of the variable clock CKV is an FCW multiple of the frequency reference clock FREF when the variable clock CKV reaches a lock with the frequency reference clock FREF.

Operations and functionalities of the reference phase accumulator 34, the variable phase accumulator 36, the TDC 40, the adder 50 and the re-timer 12 in the frequency synthesizer 60 are analogous to those in the frequency synthesizer 30, FIG. 3. The variable phase accumulator 36 is coupled to the oscillator 10, and arranged to provide a variable phase signal PHV[k] by accumulating unit count at each significant transition of the variable clock CKV. The reference phase accumulator 34 is arranged to provide the reference phase signal PHR[k] by accumulating the FCW in response to significant transitions of a re-timed frequency reference clock CKR of the re-timer 12.

The phase shifter 66, e.g., a digital-to-time converter (DTC), is coupled to the frequency reference input 32b and the TDC 40, and arranged to provide a shifted reference clock FREF' by delaying (or changing phase of) the frequency reference clock FREF in response to a shift control signal SEL. The variable clock CKV and the shifted reference clock FREF' are respectively fed to the TDC 40 as the signals TDC_in and REF_in, so the TDC 40 detects (quantizes) an error −e'[k] (a time difference) between a significant transition of the shifted clock FREF' and a prior transition of the variable clock CKV, and provide a fractional error correction signal PHF1[k] in response. In cooperation with the phase shifter 66, the shift controller 62, e.g., a DTC compensator, is coupled to the phase shifter 66 and the adder 50, and arranged to provide the shift control signal SEL (e.g., a DTC digital control) and another fractional error correction shift PHF2[k] in response to the fractional part PHRf[k] of the reference phase signal PHR[k]. With support of the shift controller 62 and the phase shifter 66, the TDC range of the TDC 40 is arranged to be less than a fraction of the period Tv of the variable clock CKV.

Figure 8:
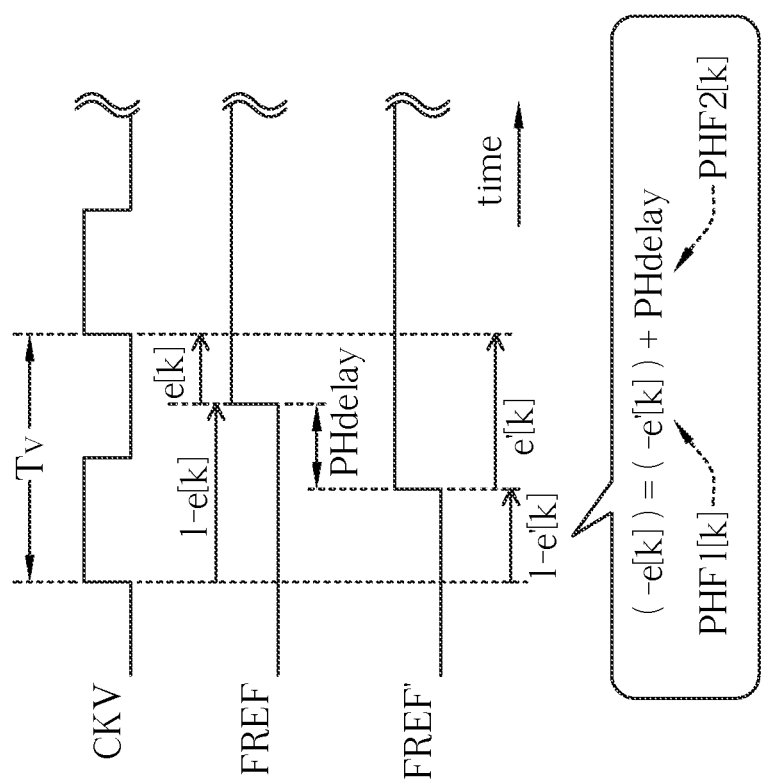

Please refer to FIG. 8 illustrating cooperation of the phase shifter 66, the shift controller 62 and the TDC 40. While phase lock needs information about the error −e[k] between a significant transition of the frequency reference clock FREF and a prior significant transition of the variable clock CKV, the shift controller 62 dynamically adjusts the shift control signal SEL and the fractional error correction signal PHF2[k] according to the fractional part of the reference phase signal PHR[k], so the shift control signal SEL and the fractional error correction signal PHF2[k] update following the deterministic part of the error −e[k]. The phase shifter 66 is arranged to change phase (equivalently delay) of the frequency reference clock FREF by a phase offset PHdelay which is set according to the shift control signal SEL, wherein the phase offset PHdelay is such arranged that the error −e'[k] between a significant transition of the shifted reference clock FREF' and a subsequent significant transition of the variable clock CKV is less than a fraction of full range of the period Tv (also less than or equal to the error −e'[k]). Equivalently, the phase offset PHdelay is subtracted from the error −e[k] to form the error −e'[k]. Because the TDC 40 only quantizes a shorter error −e'[k] instead of the error −e[k], TDC 40 benefits from a reduced TDC range. The fractional error correction signal PHF2[k] is arranged to compensate the subtracted phase offset PHdelay, as shown in FIG. 7 and FIG. 8.

For example, when the error −e[k] is in a range of ¼ to ½, the shift controller 62 sets the phase offset PHdelay to preferably (¼)*Tv, then the error −e'[k] to be measured by the TDC 40 is in a range of 0 to ¼. When the error −e[k] is in a range of ½ to ¾, the shift controller 62 switches to set the phase offset PHdelay to preferably (½)*Tv, so the error −e'[k] to be measured by the TDC 40 is maintained in the range of 0 to ¼, rather than full range of 0 to 1. Because the TDC 40 is arranged to respond when a transition of the variable clock CKV and a transition of the shifted reference clock FREF' occur in a proximity of the TDC range, and not to respond when transitions of the variable clock CKV and transitions of the shifted reference clock FREF' do not occur in a proximity of the TDC range, hardware complexity (e.g., required delay units) of the TDC 40 is effectively reduced, leading to lower power consumption, less supply interference and enhanced linearity, etc.

In an embodiment, frequency of the frequency reference clock FREF is much lower than frequency of the RF variable clock CKV, so the phase shifter 66 only needs to work at low-speed. In an embodiment, the phase shifter 66 is implemented by a DTC which converts the digital shift control signal SEL (DTC digital control) to the phase offset PHdelay (a delay time interval). The DTC can be implemented by a digitally programmable delay line. To ensure appropriate immunity against PVT (process, supply voltage and temperature) variation, proper mechanism and/or procedure for calibrating the DTC can be included in the frequency synthesizer 60.

In the embodiment of FIG. 3, FIG. 5 and FIG. 7, the oscillator 10 works as a tuned oscillator; it is tuned so the variable clock CKV is tracking the frequency reference clock FREF. The signal PHE[k] provided by the adder 50 feeds back to the oscillator 10 through the loop filter 38, and then the variable clock CKV can be further tuned in a finer sense. In an embodiment, the loop filter 38 is a digital low pass filter. The loop filter 38 can be constructed as a combination of FIR (finite impulse response) and IIR (infinite impulse response) filters. For example, in an embodiment, the loop filter 38 is arranged to provide the OTW by linearly combining the signal PHE and an accumulation of the signal PHE, so the frequency synthesizer is a type II loop.

In the embodiment shown in FIG. 3, FIG. 5 and FIG. 7, the TDC 40 receives the high-speed shifted variable clock CKV' (FIG. 3 and FIG. 5) or the variable clock CKV (FIG. 7) as the signal TDC_in, and receives the low-speed frequency reference clock FREF (FIG. 3 and FIG. 5) or the shifted reference clock FREF' (FIG. 7) as the signal REF_in. The TDC 40 quantizes the time difference between the signals TDC_in and REF_in, and updates the fractional error correction signal PHF1[k] at significant transitions of the signal REF_in. However, the TDC 40 is kept receiving the high-speed toggling signal TDC_in, no matter the fractional error correction signal PHF1[k] of the TDC 40 is triggered to update or not. High-speed toggling consumes large power, induces serious supply interference, and therefore degrades linearity of time-to-digital conversion. To address the issue, a power management is arranged to suppress unnecessary pulses in the signal TDC_in, only to keep a single pulse closest to a subsequent significant transition of the signal REF_in, such that power consumption and supply interference are reduced without comprising normal time-to-digital conversion.

Figure 9:
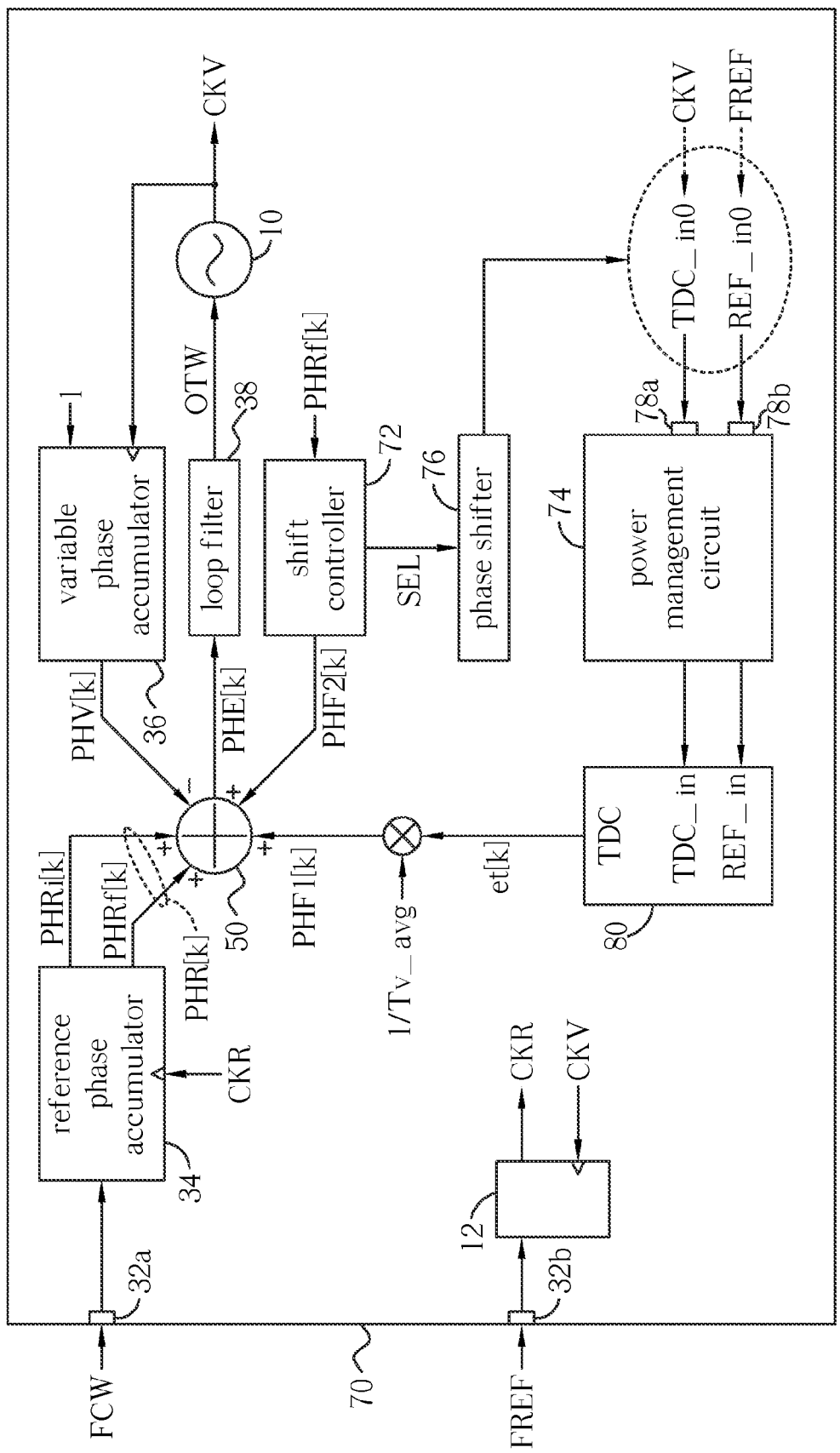
FIG. 9 illustrates a frequency synthesizer according to an embodiment of the invention.

Please refer to FIG. 9 illustrating a frequency synthesizer 70 according to an embodiment of the invention. Similar to the frequency synthesizers 30 and 60, the frequency synthesizer 70 includes an FCW input 32a for receiving an FCW, a frequency reference input 32b for receiving a frequency reference clock FREF, an oscillator 10 for generating a variable clock CKV, a re-timer 12 for providing a re-timed reference clock CKR by re-timing the frequency reference clock FREF at significant transition of the variable clock CKV, a reference phase accumulator 34 for providing a reference phase signal PHR[k] by accumulating the FCW in response to the re-timed reference clock CKR, a variable phase accumulator 36 for providing a variable phase signal PHV[k] by accumulating unit count at significant transitions of the variable clock CKV, a TDC 80 for providing a fractional error correction signal PHF1[k] by quantizing a time difference between the signals TDC_in and REF_in, an adder 50 for providing the signal PHE[k], and a loop filter 38 for providing an OTW to the oscillator 10 in response to the signal PHE[k].

In addition, the frequency synthesizer 70 further includes a variable clock input 78a for receiving a signal TDC_in0, another frequency reference input 78b for receiving a signal REF_in0, a shift controller 72, a phase shifter 76 and a power management circuit 74. The shift controller 72, is arranged to provide another fractional error correction signal PHF2[k] and the shift control signal SEL in response to a fractional part PHRf[k] of the reference phase signal PHR[k], so the adder 50 produces the signal PHE by adding an arithmetic difference (PHR[k]−PHV[k]) and an arithmetic sum (PHF1 [k]+PHF2[k]). The phase shifter 76 is coupled to the shift controller 72, and arranged to change phase of the variable clock CKV or the frequency reference clock FREF, and the signals TDC_in0 and REF_in0 are therefore provided according to the variable clock CKV and the frequency reference clock FREF respectively. The power management circuit 74 is coupled to the variable clock input 78a and the frequency reference input 78b for outputting the signals REF_in and TDC_in, wherein the signal TDC_in is provided as a single pulse of the signal TDC_in0 ahead of a subsequent significant transition of the signal REF_in.

In an embodiment, cooperation of the shift controller 72 and the phase shifter 76 is similar to cooperation of the shift controller 42 and the phase shifter 46 (FIG. 3); the phase shifter 76 changes phase of the variable clock CKV by the phase offset PHoffset in response to the shift control signal SEL, and accordingly provides the shifted variable clock CKV' as the signal TDC_in0. The shift controller 72 injects the fractional error correction signal PHF2[k] to compensate the phase offset PHoffset, and the frequency reference clock FREF is provided to the power management circuit 74 as the signal REF_in0.

In another embodiment, cooperation of the shift controller 72 and the phase shifter 76 is similar to cooperation of the shift controller 62 and the phase shifter 66 (FIG. 7); the phase shifter 76 delays the frequency reference clock FREF by the phase offset PHdelay in response to the shift control signal SEL, and accordingly provides the shifted reference clock FREF' as the signal REF_in0. The shift controller 72 injects the fractional error correction signal PHF2[k] to compensate the phase offset PHdelay, and the variable clock CKV is provided to the power management circuit 74 as the signal TDC_in0.

Through cooperation of the shift controller 72 and the phase shifter 76, the time difference (the error −e'[k]) between the signals TDC_in0 and REF_in0 is kept in a range shorter than full range of the period Tv.

Figure 10:
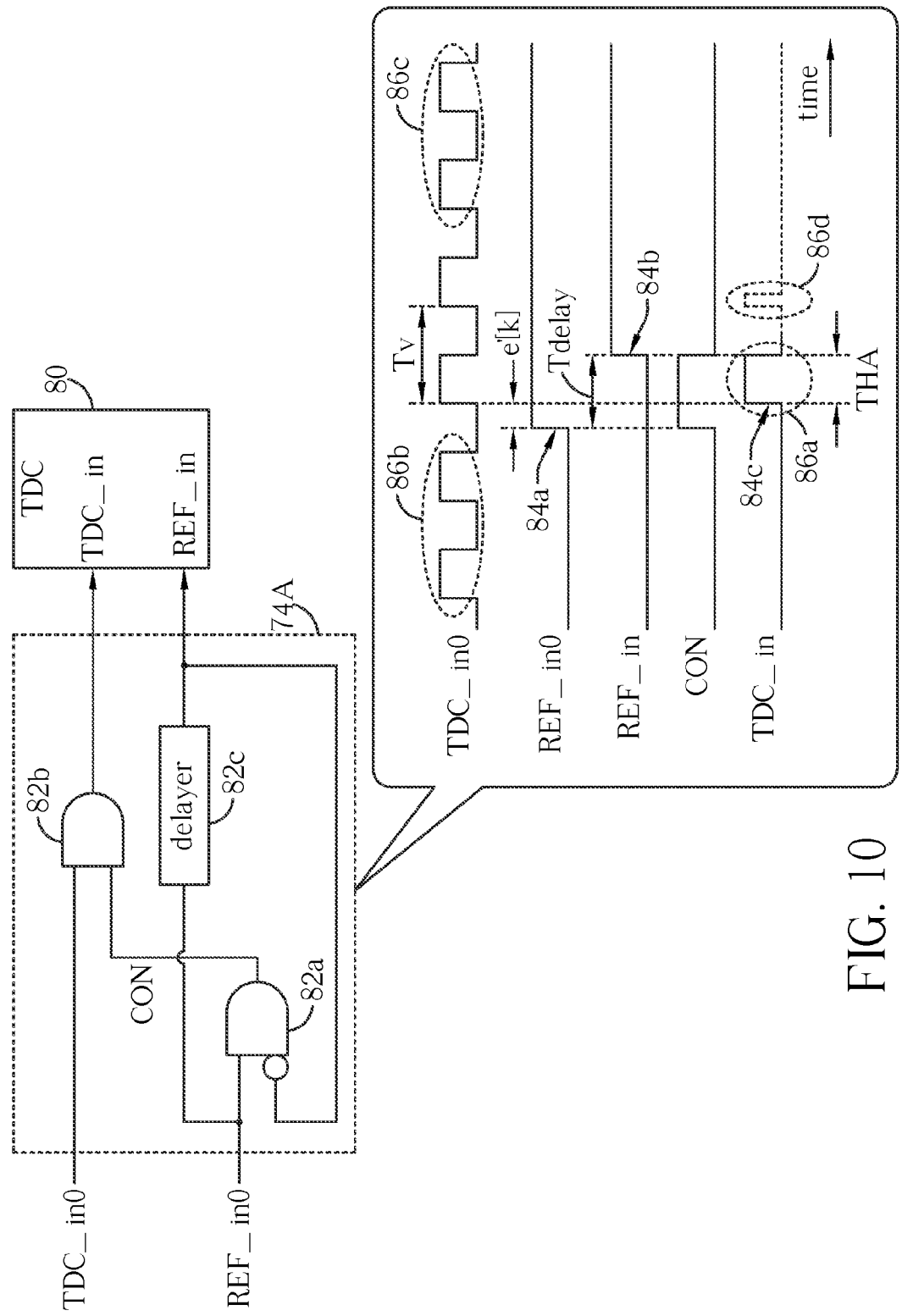
FIG. 10 illustrates an embodiment of the power management circuit in FIG. 9 according to the invention.

Please refer to FIG. 10 illustrating a power management circuit 74A according to an embodiment of the invention, which can be adopted to implement the power management circuit 74 shown in FIG. 9. The power management circuit 74A includes two logic gates 82a and 82b, and a delayer (delay element) 82c. The logic gate 82a is coupled to the signal REF_in0 and the REF_in at two inputs, and arranged to provide a gating signal CON in response to a logic operation result of the signals REF_in0 and REF_in, e.g., an AND of the signal REF_in0 and an inversion of the signal REF_in. The delayer 82c is coupled to the signal REF_in0 and the logic gate 82a, and arranged to provide the signal REF_in by delaying the signal REF_in0 with a delay time Tdelay. The logic gate 82b is coupled to the gating signal CON and the signal TDC_in0 at two inputs, and arranged to provide the signal TDC_in in response to an AND logic operation result of the signal TDC_in0 and the gating signal CON.

When the signal REF_in0 transits from logic 0 to logic 1 at a significant transition 84a, the logic gate 82a is arranged to set the gating signal to logic 1, and when the signal REF_in transits from logic 0 to logic 1 at a significant transition 84b, the logic gate 82a is arranged to set the gating signal CON back to logic 0. Hence, the gating signal CON maintains a window of logic 1 during the delay time Tdelay between the significant transitions 84a and 84b. When the gating signal CON is of logic 0, the logic gate 82b is arranged to suppress pulses of the signal TDC_in0; and when the gating signal CON is of logic 1, the logic gate 82b is arranged to provide a single pulse 86a ahead of the subsequent significant transition 84b for the signal TDC_in by tracking the signal TDC_in0. In other words, as the signal TDC_in is provided according to the signal TDC_in0, only the single pulse 86a is reserved in the signal TDC_in, and other unnecessary pulses of the signal TDC_in0, such as pulses 86b and 86c, are suppressed by the gating signal CON. The signals REF_in and TDC_in are transmitted to the TDC 80, so the error −e'[k] is obtained as the TDC 80 detects (quantizes) a timing difference corresponding to an interval THA between a significant transition 84c of the pulse 86a and the subsequent significant transition of the signal REF_in.

By suppressing unnecessary pulses and maintaining a single pulse before a subsequent significant transition of the signal REF_in, high-speed toggling of the TDC 80 is avoided without compromising normal function of the TDC 80, thus power consumption is effectively reduced, and linearity of time-to-digital conversion is enhanced due to suppressed supply interference. The proper operation of the TDC 80 is not violated whether one (or more) pulse, such as the pulse 86d, appears in the signal TDC_in after the significant transition 84b of the signal REF_in, since the interval THA is measured (updated) before the significant transition 86d. The extra pulses, however, could negatively affect the power supply network operation, hence they are not desirable.

Due to cooperation of the shift controller 72 and the phase shifter 76, duration of the error −e'[k] between the signals TDC_in0 and REF_in0 is in the TDC range shorter than the period Tv, and the delay time Tdelay can be set shorter than the period Tv. On the contrary, if duration of the error −e'[k] distributes in full range of the period Tv, the delay time Tdelay has to be longer than the period Tv to ensure the window of the delay time Tdelay can capture at least a significant transition in the signal TDC_in when duration of the error −e'[k] is long. However, as the delay time Tdelay is longer than the period Tv, the window tends to capture more than one pulses in the signal TDC_in, and linearity of time-to-digital conversion could be, therefore, degraded, since more than one pulse before the significant transition 84b induce higher supply interference when the interval THA is measured.

For a proper setting of the delay time Tdelay, a lower bound of the delay time Tdelay is the TDC range, an upper bound is set to avoid additional pulse(s) before the significant transition 84b. Accordingly, an accepted variation of the delay time Tdelay is plus or minus (Tv/2−Tc)/2, where Tc denotes the TDC range.

Figure 11:
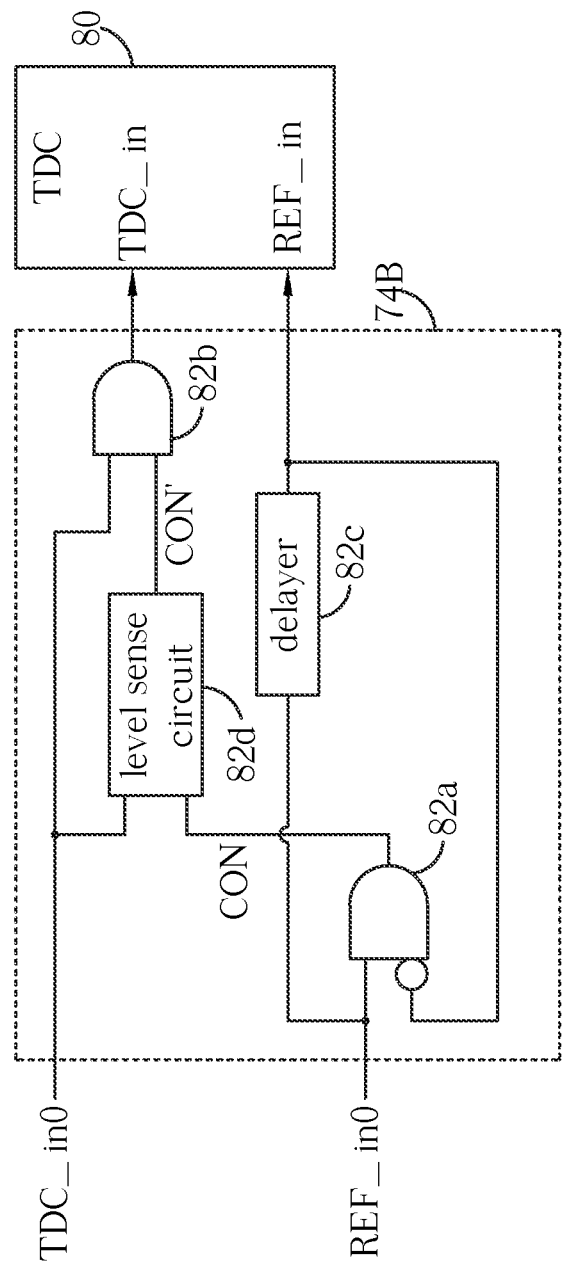
FIG. 11 illustrates an embodiment of the power management circuit in FIG. 9 according to the invention.
Figure 12:
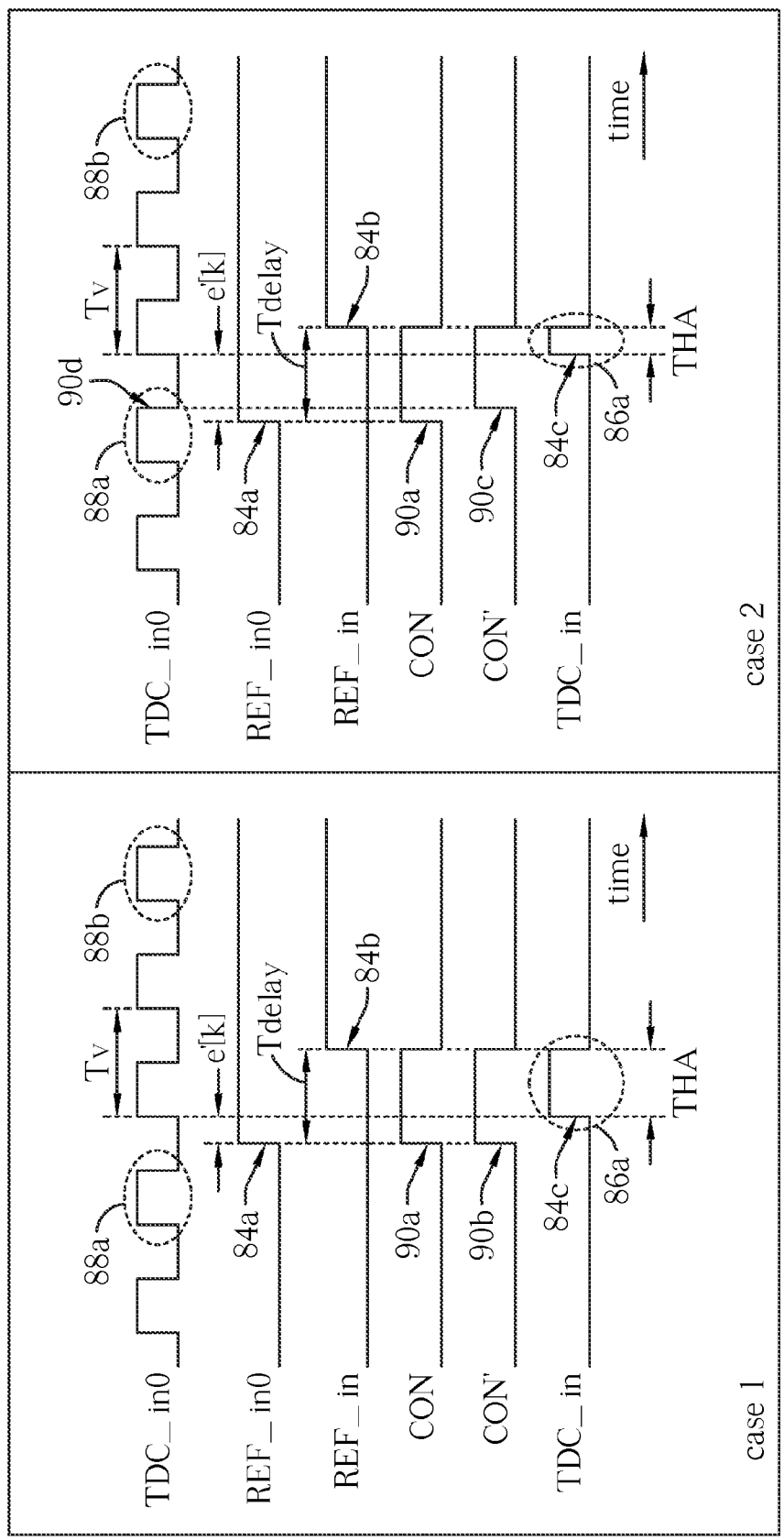
FIG. 12 illustrates operation examples of the power management circuit in FIG. 11 according to an embodiment of the invention.

Please refer to FIG. 11 and FIG. 12; FIG. 11 illustrates another power management circuit 74B according to an embodiment of the invention, and FIG. 12 demonstrates operation of the power management circuit 74B in two different cases. The power management circuit 74B can be adopted to implement the power management circuit 74 shown in FIG. 9. The power management circuit 74B includes two logic gates 82a and 82b, a delayer 82c and a level sense circuit 82d. The logic gate 82a is coupled to the signal REF_in0 and the REF_in at two inputs, and arranged to provide a gating signal CON in response to a logic operation result of the signals REF_in0 and REF_in. The delayer 82c is coupled to the signal REF_in0 and the logic gate 82a, and arranged to provide the signal REF_in by delaying the signal REF_in0 with a delay time Tdelay. The level sense circuit 82d is coupled to the signal TDC_in0 and the gating signal CON at two inputs, and arranged to provide another gating signal CON' in response to the signal TDC_in0 and the gating signal CON. The logic gate 82b is coupled to the gating signal CON' and the signal TDC_in0 at two inputs, and arranged to provide the signal TDC_in in response to an AND logic operation result of the signal TDC_in0 and the gating signal CON'.

As shown in FIG. 12, when the REF_in0 transits from logic 0 to logic 1 at a significant transition 84a, the logic gate 82a is arranged to set the gating signal CON to logic 1, and when the signal REF_in transits from logic 0 to logic 1 at a significant transition 84b, the logic gate 82a is arranged to set the gating signal CON back to logic 0. As shown in case 1 of FIG. 12, when the gating signal CON transits from logic 0 to logic 1 at a transition 90a, if the signal TDC_in0 is of logic 0, the level sense circuit 82d is arranged to set the gating signal CON' to logic 1 at a transition 90b. On the other hand, as shown in case 2 of FIG. 12, when the gating signal CON transits from logic 0 to logic 1 at the transition 90a, if the signal TDC_in0 is of logic 1, the level sense circuit 82d is arranged to set the gating signal CON' to logic 1 later at a transition 90c, when the signal TDC_in0 transits back to logic 0. The level sense circuit 82d is further arranged to set the gating signal CON' back to logic 0 when the gating signal CON transits back to logic 0. In other words, during the window of the delay time Tdelay opened by the gating signal CON, the level sense circuit 82d opens a second window in the gating signal CON', when the signal TDC_in0 is of logic 0.

When the gating signal CON' is of logic 0, the logic gate 82b is arranged to suppress pulses of the signal TDC_in0, like the pulses 88a and 88b. When the gating signal CON' is of logic 1, the logic gate 82b is arranged to provide a single pulse 86a for the signal TDC_in by tracking the signal TDC_in0, such that only a significant transition 84c of the pulse 86a exists ahead of the significant transition 84b of the signal REF_in. The TDC 80 detects the error −e'[k] by measuring an interval between the significant transitions 84c and 84b. In the signal TDC_in, because only the single pulse 86a presents before the significant transition 84b, unnecessary toggling of the TDC 80 is prevented, and linearity of the TDC 80 is enhanced.

As shown in case 2 of FIG. 12, if the gating signal CON is used to gate pulses of the signal TDC_in0, an additional pulse between the significant transition 90a and a falling edge 90d would be included in the signal TDC_in, and it could degrade linearity of the TDC 80. However, because the level sense circuit 82d adaptively avoids the duration when the signal TDC_in0 is of logic 1, the additional pulse is excluded by the narrower window of the gating signal CON'; thus, existence of only a single pulse before the significant transition 84b is ensured for linearity preservation. By operation of the level sense circuit 82d, the power management circuit 74B is more robust with improved immunity against delay variation of the delayer 82c, since tolerable delay variation of the delay time Tdelay is expanded to plus or minus (Tv−Tc)/2.

Figure 13:
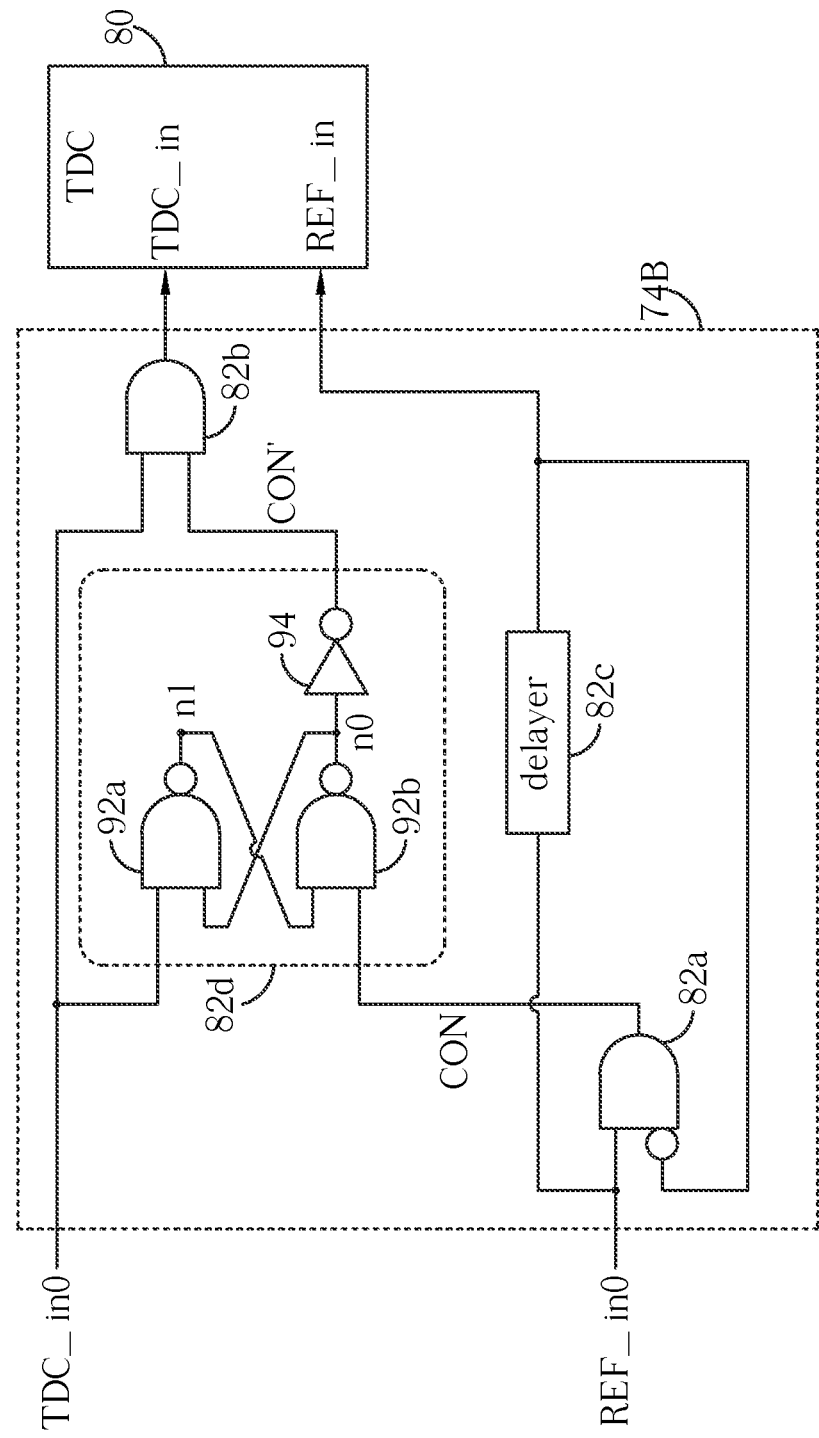
FIG. 13 illustrates an implementation example of the level sense circuit in FIG. 11 according to an embodiment of the invention.

Please refer to FIG. 13 illustrating an example of the level sense circuit 82d, which includes an SR latch formed by two NAND gates 92a and 92b, as well as an inverter 94. The NAND gate 92a is respectively coupled to the signal TDC_in0, a node n0 and a node n1 at two inputs and an output. The NAND gate 92b is respectively coupled to the gating signal CON, the node n1 and the node n0 at two inputs and an output. The inverter 94 is coupled between the NAND gate 92b and the logic gate 82b. The gating signal CON' is latched at logic 0 when the signal TDC_in0 is of logic 1, and released to follow the gating signal CON when the signal TDC_in0 is of logic 0.

To sum up, supporting peripherals for TDC in digital frequency synthesizer are provided. While monitoring the time difference (phase error) between the variable clock and the frequency reference clock by the TDC, phase of one of the variable clock and the frequency reference clock is adaptively shifted according to accumulation of the FCW, so the time difference is maintained in a partial range of the period of the variable clock, and TDC range can thus be set less than the period of the variable clock. In addition, unnecessary high-frequency toggling pulses to the TDC can be gated without compromising normal function of the TDC. Shorter TDC range and gated TDC toggling lead to advantages such as enhanced linearity of time-to-digital conversion, reduced hardware complexity, lower power consumption, smaller layout area, less required decoupling capacitance, and suppressed supply interference of the frequency synthesizer.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A time-to-digital system comprising:
    a frequency reference input for receiving a frequency reference clock;
    a variable clock input for receiving a variable clock, said variable clock being of substantially higher frequency than said frequency reference clock;
    a power management circuit coupled to said frequency reference input and said variable clock input, said power management circuit outputting a delayed frequency reference clock and a single pulse of said variable clock ahead of a transition of said delayed frequency reference clock, wherein a second pulse transition of said single pulse occurs at said transition of said delayed frequency reference clock;
    a time-to-digital converter (TDC) for producing a digital TDC output by quantizing a time difference between a first pulse transition of said single pulse and said transition of said delayed reference clock, said TDC coupled to said power management circuit.

2. The time-to-digital system of claim 1, wherein said power management circuit comprises:
    a first logic gate coupled to said frequency reference clock and said delayed frequency reference clock, and arranged to provide a gating signal in response to a first logic operation result of said frequency reference clock and said delayed frequency reference clock;
    a delayer coupled to said frequency reference clock for providing said delayed frequency reference clock by delaying said frequency reference clock; and
    a second logic gate coupled to said gating signal and said variable clock for providing said single pulse of said variable clock in response to a second logic operation result of said variable clock and said gating signal.

3. The time-to-digital system of claim 2, wherein when said frequency reference clock transits from a first level to a second level, said first logic gate is arranged to set said gating signal to said second level, and when said delayed frequency reference clock transits from said first level to said second level, said first logic gate is arranged to set said gating signal to said first level; and wherein when said gating signal is of said first level, said second logic gate is arranged to suppress pulses of said variable clock; and when said gating signal is of said second level, said second logic gate is arranged to provide said single pulse of said variable clock by tracking said variable clock.

4. The time-to-digital system of claim 1, wherein said power management circuit comprises:
    a first logic gate coupled to said frequency reference clock and said delayed frequency reference clock, and arranged to provide a first gating signal in response to a first logic operation result of said frequency reference clock and said delayed frequency reference clock;
    a delayer coupled to said frequency reference clock for providing said delayed frequency reference clock by delaying said frequency reference clock;
    a level sense circuit coupled to said variable clock, said first gating signal and said second logic gate for providing a second gating signal in response to said variable clock and said first gating signal;
    a second logic gate coupled to said second gating signal and said variable clock for providing said single pulse of said variable clock in response to a second logic operation result of said variable clock and said second gating signal.

5. The time-to-digital system of claim 4, wherein when said frequency reference clock transits from a first level to a second level, said first logic gate is arranged to set said first gating signal to said second level, and when said delayed frequency reference clock transits from said first level to said second level, said first logic gate is arranged to set said first gating signal to said first level; and wherein when said first gating signal transits from said first level to said second level while said variable clock is of said first level, said level sense circuit is arranged to set said second gating signal to said second level; and when said first gating signal transits from said first level to said second level while said variable clock is of said second level, said level sense circuit is arranged to set said second gating signal to said second level when said variable clock transits back to said first level.

6. The time-to-digital system of claim 5, wherein when said second gating signal is of said first level, said second logic gate is arranged to suppress pulses of said variable clock; and when said second gating signal is of said second level, said second logic gate is arranged to provide said single pulse of said variable clock by tracking said variable clock.

7. The time-to-digital system of claim 6, wherein said level sense circuit is further arranged to set said second gating signal to said first level when said first gating signal transits to said first level.

8. The time-to-digital system of claim 4, wherein said level sense circuit comprises a latch.

9. The time-to-digital system of claim 1 further comprising:
    a phase shifter coupled to said power management circuit, and arranged to adjust a second time difference between a transition of said frequency reference clock and a transition of said variable clock, such that said second time difference is less than a period of said variable clock.

10. The time-to-digital system of claim 1 further comprising:
    an oscillator coupled to said variable clock input for tuning periods of said variable clock according to said digital TDC output, such that said time-to-digital system functions as a frequency synthesizer.

11. A frequency synthesizer comprising:
    a power management circuit arranged to output a second reference clock and a second variable clock in response to a first reference clock and a first variable clock, such that a single pulse between a transition of said first reference clock and a subsequent transition of said second reference clock is provided in said second variable clock, wherein a second pulse transition of said single pulse occurs at said subsequent transition of said second reference clock; and a time-to-digital converter (TDC) coupled to said power management circuit, and arranged to provide a first fractional error correction signal by quantizing a time difference between said subsequent transition of said second reference clock and a first pulse transition of said second variable clock.

12. The frequency synthesizer of claim 11 further comprising:

an oscillator arranged to provide an original variable clock; and a phase shifter coupled between said oscillator and said power management circuit, and arranged to provide said first variable clock by shifting phase of said original variable clock, such that a second time difference between a transition of said first reference clock and a transition of said first variable clock is less than a period of said original variable clock;

wherein said oscillator is further arranged to tune periods of said original variable clock according to said first fractional error correction signal.

13. The frequency synthesizer of claim 12 further comprising:

a shift controller coupled to said phase shifter, and arranged to provide a shift control signal in response to an accumulated value of a frequency command word (FCW);

wherein said phase shifter is arranged to adjust a phase offset between said original variable clock and said first variable clock in response to said shift control signal.

14. The frequency synthesizer of claim 11 further comprising:

an oscillator arranged to provide said first variable clock; and a phase shifter coupled to an original reference clock and said power management circuit, and arranged to provide said first reference clock by shifting phase of said original reference clock, such that a time difference between a transition of said first reference clock and a transition of said first variable clock is less than a period of said original variable clock;

wherein said oscillator is further arranged to tune period of said first variable clock according to said first fractional error correction signal.

15. The frequency synthesizer of claim 14 further comprising:

a shift controller coupled to said phase shifter, and arranged to provide a shift control signal in response to an accumulated value of a frequency command word (FCW);

wherein said phase shifter is arranged to adjust a phase offset between said original reference clock and said first reference clock in response to said shift control signal.

16. The frequency synthesizer of claim 11 further comprising:

a shift controller arranged to provide a second fractional error correction signal in response to an accumulated value of a frequency command word (FCW); and an oscillator arranged to tune periods of said first variable clock according to said first fractional error correction signal and said second fractional error correction signal.

17. The frequency synthesizer of claim 11, wherein said power management circuit comprises:

a first logic gate coupled to said first reference clock and said second reference clock, and arranged to provide a gating signal in response to a first logic operation result of said first reference clock and said second reference clock;

a delayer coupled to said first reference clock and said first logic gate for providing said second reference clock by delaying said first reference clock; and a second logic gate coupled to said gating signal and said first variable clock for providing said second variable clock in response to a second logic operation result of said first variable clock and said gating signal.

18. The frequency synthesizer of claim 17, wherein when said first reference clock transits from a first level to a second level, said first logic gate is arranged to set said gating signal to said second level, and when said second reference clock transits from said first level to said second level, said first logic gate is arranged to set said gating signal to said first level; and wherein when said gating signal is of said first level, said second logic gate is arranged to suppress pulses of said second variable clock; and when said gating signal is of said second level, said second logic gate is arranged to provide said single pulse of said second variable clock by tracking said first variable clock.

19. The frequency synthesizer of claim 11, wherein said power management circuit comprises:

a first logic gate coupled to said first reference clock and said second reference clock, and arranged to provide a first gating signal in response to a first logic operation result of said first reference clock and said second reference clock;

a delayer coupled to said first reference clock and said first logic gate for providing said second reference clock by delaying said first reference clock;

a level sense circuit coupled to said first variable clock, said first gating signal and said second logic gate for providing a second gating signal in response to said first variable clock and said first gating signal;

a second logic gate coupled to said second gating signal and said variable clock for providing said second variable clock in response to a second logic operation result of said first variable clock and said second gating signal.

20. The frequency synthesizer of claim 19, wherein when said first reference clock transits from a first level to a second level, said first logic gate is arranged to set said first gating signal to said second level, and when said second reference clock transits from said first level to said second level, said first logic gate is arranged to set said first gating signal to said first level; and wherein when said first gating signal transits from said first level to said second level while said first variable clock is of said first level, said level sense circuit is arranged to set said second gating signal to said second level; and when said first gating signal transits from said first level to said second level while said first variable clock is of said second level, said level sense circuit is arranged to set said second gating signal to said second level when said first variable clock transits back to said first level.

21. The frequency synthesizer of claim 20, wherein when said second gating signal is of said first level, said second logic gate is arranged to suppress pulses of said second variable clock; and when said second gating signal is of said second level, said second logic gate is arranged to provide said single pulse of said second variable clock by tracking said first variable clock.

22. A time-to-digital system comprising:
a frequency reference input for receiving a frequency reference clock;
a variable clock input for receiving a variable clock, said variable clock being of substantially higher frequency than said frequency reference clock;
a power management circuit coupled to said frequency reference input and said variable clock input, said power management circuit outputting a delayed frequency reference clock and only one single pulse of said variable clock ahead of a transition of said delayed frequency reference clock;
a time-to-digital converter (TDC) for producing a digital TDC output, said TDC coupled to said power management circuit.

23. A time-to-digital system comprising:
a frequency reference input for receiving a frequency reference clock;
a variable clock input for receiving a variable clock, said variable clock being of substantially higher frequency than said frequency reference clock;
a power management circuit coupled to said frequency reference input and said variable clock input, said power management circuit outputting a delayed frequency reference clock and a single pulse of said variable clock ahead of a transition of said delayed frequency reference clock, wherein when a first gating signal is generated in response to said frequency reference clock and said delayed frequency reference clock, and if said variable clock is of a first logic level when the gating signal transits from a second logic level to the first logic level, a second gating signal is generated for providing said single pulse of said variable clock.

* * * * *